(12) United States Patent
Wang et al.

(10) Patent No.: US 8,967,833 B2
(45) Date of Patent: Mar. 3, 2015

(54) LED LENS AND LIGHT SOURCE DEVICE USING THE SAME

(75) Inventors: Chih-Peng Wang, Taipei (TW);
Huang-Chang Chen, Taipei (TW);
Kuo-Hsuan Hsu, Taipei (TW); Jui-Wen Lee, Taipei (TW)

(73) Assignee: E-Pin Optical Industry Co., Ltd., Taipei (TW)

( * ) Notice: Subject to any disclaimer, the term of this patent is extended or adjusted under 35 U.S.C. 154(b) by 206 days.

(21) Appl. No.: 13/593,849

(22) Filed: Aug. 24, 2012

(65) Prior Publication Data
US 2013/0094218 A1    Apr. 18, 2013

(30) Foreign Application Priority Data

Oct. 18, 2011   (TW) .............................. 100137863 A

(51) Int. Cl.
| | | |
|---|---|---|
| F21V 3/00 | (2006.01) | |
| F21V 5/00 | (2006.01) | |
| F21V 5/04 | (2006.01) | |
| G02B 3/02 | (2006.01) | |
| G02B 13/18 | (2006.01) | |
| G02B 19/00 | (2006.01) | |
| G02B 3/04 | (2006.01) | |
| G02B 27/09 | (2006.01) | |
| H01L 33/58 | (2010.01) | |
| F21Y 101/02 | (2006.01) | |

(52) U.S. Cl.
CPC ........ *G02B 19/0014* (2013.01); *G02B 19/0071* (2013.01); *F21V 5/046* (2013.01); *G02B 3/04* (2013.01); *F21V 5/04* (2013.01); *G02B 27/0955* (2013.01); *F21Y 2101/02* (2013.01); *H01L 33/58* (2013.01); *G02B 19/0061* (2013.01)

USPC ............ 362/311.02; 362/311.01; 362/311.06; 362/335; 359/708

(58) Field of Classification Search
CPC .............. G02B 3/04; F21V 5/04; F21V 5/046
USPC ............... 362/311.01, 311.02, 311.06–311.1, 362/326, 335; 313/512; 257/98, 100; 359/642, 708, 711, 712
See application file for complete search history.

(56) References Cited

U.S. PATENT DOCUMENTS

| | | | |
|---|---|---|---|
| 7,181,378 B2* | 2/2007 | Benitez et al. ..................... 703/2 |
| 7,244,924 B2* | 7/2007 | Kiyomoto et al. ............ 250/216 |
| 7,348,723 B2 | 3/2008 | Yamaguchi et al. |
| 7,474,475 B2 | 1/2009 | Paek et al. |
| 7,621,657 B2 | 11/2009 | Ohkawa |

(Continued)

*Primary Examiner* — Robert May
*Assistant Examiner* — Alexander Garlen
(74) *Attorney, Agent, or Firm* — Muncy, Geissler, Olds & Lowe., P.C.

(57) ABSTRACT

The present invention discloses an LED lens and a light source device using the same. The light source device includes the LED lens and a LED. The LED lens comprises a light incident surface, a light emitting surface, and a bottom surface. The light emitting surface includes a recession portion disposed at the central thereof and a convex portion connected to the recession portion. The light incident surface is a concave surface and comprises a first optically active area and a second optically active area. The first optically active area is disposed at the central of the light incident surface; the second optically active area is connected to the first optically active area and the bottom surface. At the junction between the first optically active area and the second optically active area, it is an optical path inversion point that is disposed satisfying specific condition.

13 Claims, 22 Drawing Sheets

(56) References Cited

U.S. PATENT DOCUMENTS

| | | |
|---|---|---|
| 7,746,565 B2 | 6/2010 | Paek et al. |
| 7,766,530 B2 * | 8/2010 | Hwang et al. ............ 362/613 |
| 7,798,679 B2 | 9/2010 | Kokubo et al. |
| 7,866,844 B2 | 1/2011 | Yamaguchi |
| 7,963,680 B2 | 6/2011 | Yoon et al. |
| 2009/0116245 A1 | 5/2009 | Yamaguchi |

* cited by examiner

LED LENS AND LIGHT SOURCE DEVICE USING THE SAME

FIELD OF THE INVENTION

The present invention relates to a lens and a light source device using the same, and more particularly to an LED lens and a light source device applied for various illumination devices using light-emitting diodes (LEDs) as light source.

BACKGROUND OF THE INVENTION

LCD displays are widely used in TVs, notebook computers, PCs, mobile phones, and other electronic products with display function. In an LCD display, cold cathode fluorescent lamps (CCFLs), field-effect light-emitting devices (EL), light-emitting diodes, or other elements capable of emitting a visible light are used as a backlight. In recent years, LED has gradually been a preferred backlight source instead of CCFLs because it has many advantage including: long lifetime (about 100,000 hours), capable of optimizing color gamut, small size/design flexibility, driven by low-voltage power supply, quicker turn-on time, without an inverter, operated efficiently over a wider temperature range and so on.

An LED backlight device comprises an LED matrix for providing an LCD panel illumination. In order to make the LCD panel be illuminated with uniform light, and prevent bright spots being generated on the LCD panel, improving a lens which covers the LED so as to refract the light from LED is the mainly solution in prior arts. Therefore, in the LCD display using LEDs as backlight source, how to enhance the uniformity of brightness or make the light distribution be wider is the key point to improve the LED backlight device. For example, U.S. Pat. Nos. 7,348,723, 7,963,680, 7,621,657, 7,798,679, 7,866,844, 7,766,530, US Patent Publication No. 20090116245, U.S. Pat. Nos. 7,474,475, and 7,746,565 all disclose lenses or LED devices designed for an LCD panel.

A lens 13 and a light source device 1 shown as FIG. 1 is disclosed in U.S. Pat. No. 7,348,723. The light source device 1 comprises a light emitting element 11 mounted on a substrate 12 and the lens 13. The light emitting element 11 is disposed in a hemispherical recession 10 of the lens 13, and emits light thereby travelling within the lens 13 and then emitted from a light control emission face 130 of the lens 13. The light control emission face 130 includes a first light emitting region 130a and a second light emitting region 130b, wherein the first light emitting region 130a has a gently curved downward-convex configuration; the second light emitting region 130b extends around the first light emitting region 130a and has a gently curved upward-convex configuration. FIG. 2 is a diagram showing a distribution of emission intensity from the light source device 1. The light source device 1 generates a round light pattern with higher intensities in the paraxial region and lower intensities in the off-axis region.

However, although the light pattern generated by the light source device 1 gives lower intensities in the paraxial region, the light source device 1 still can't solve the problem of having bright dots in the paraxial region on the illuminated object. Moreover, in order to modify the uneven light pattern generated on the LCD panel, the light source devices 1 in a backlight module might have to be arranged closer to each other. Furthermore, due to the increasing requirement of thinner display monitors and a consideration of cost, such light source device 1 must be improved about increasing the light emission angle thereof to shorten the distance between the light source device 1 and LCD panel or to increase the distance between each light source device 1. However, significant light refraction by the light control emission face 130 generally increases a reflex flux, leads to the Fresnel's reflection phenomenon happened. That is, the total flux of the light emitted from the light control emission face 130 decreases. In addition, part of light emitted from the region where the incident angle is equal to the corresponding emission angle is overlapped each other thus outgoing light fluxes are concentrated, thereby causing of a ring-shaped bright line in the light pattern. In a result, the light source device 1 is hard to have both the perfect scattering ability and the perfect uniformity of scattering property. A light source device disclosed in U.S. Pat. No. 7,621,657 is similar to the light source device 1 disclosed in U.S. Pat. No. 7,348,723, it also has the shortcomings that the paraxial zone of the light source device is too bright and it is difficult to achieve the requirement of high scattering ability.

U.S. Pat. No. 7,766,530 discloses a light source device including an optical lens having a bell shape. However, this type light source device also generates a light pattern with higher intensities in the paraxial region. In addition, due to a concave surfaces of the lens make light away from the optical axis of the light source device be refract to further close to the optical axis; and a convex surfaces of the optical lens make the incident light be refract to further away from the optical axis, this type light source device has the shortcomings of uneven light distribution and deficient scattering ability.

For improving the scattering ability of a light source device, in the optical lenses of the light source devices disclosed in U.S. Pat. Nos. 7,963,680, 7,798,679, 7,474,475, 7,746,565, each light incident surface thereof has recession (or concave curve part) and each light emitting surface thereof has a concave part disposed at the center thereof and a convex part surrounding the concave part. Wherein, the optical lens disclosed in U.S. Pat. No. 7,963,680 has a light emitting surface including a cone-shaped central recession and a recession forming by a light incident surface being bullet-shaped with round top. However, such optical lens is still hard to achieve the requirement of making display monitors using the optical lens be thinner since the light pattern of these prior art is wider distribution cause lower intensities effect in the paraxial region. Otherwise, although U.S. Pat. No. 7,963,680 provided the optical lens to reduce the brightness of the paraxial zone of a light source device, in practical applications, light nearby the optical axis is strongly refracted by such optical lens, such that the light pattern projected by the light source device has a broadened center dark area. In a result, such optical lens is not applicable to use in thinner display monitors.

U.S. Pat. Nos. 7,474,475 and 7,746,565 disclose light source devices each including an optical lens having complicated optical surfaces, respectively. Both the optical lenses comprise a light emission surface having a recessed part rear the optical axis. Wherein, light incident on the recessed part is reflected to a refracting part being extended from the recessed part and forming a convex shape according to the total reflection effect. However, U.S. Pat. Nos. 7,474,475 and 7,746,565 are unable to provide even light pattern in practice, and such lenses are hard to process, and become thicker and low precision as its complex spherical surface.

Broadly speaking, optical surfaces are not portions of a sphere or plane called asphere, including asymmetric free-form surfaces. Because aspherical lenses have a significant effect in simplifying the structure of the optoelectronic devices, reducing the size and weight of the system, aspherical lenses are increasingly wide range of applications in the field of optoelectronic instruments.

If LED light source devices applied to a LCD display have design deficiency, they may cause the problems of bright dot, chromatism, requirement of high density lay-out or requirement of disposing other elements for promoting even light distribution. Wherein, when an LED light source device has a problem that the paraxial zone of the light source device is too bright, it may cause chromatism thereby affecting the color rendering of the LCD display. Besides, requirement of high density lay-out leads to increment of manufacturing cost, accumulation of heat and affects the device lifetime; requirement of disposing other elements further leads to increment of volume or weight of the LCD display. As LCD displays tends to be thinner, be realistic in quality and minimize cost, how to enhance the scattering ability, reduce chromatism and become thinner of an LED lens is the target that LED backlight module manufacturers anxious to improve.

SUMMARY OF THE INVENTION

The main purpose of the present invention is to provide an LED lens and a light source device applied to an LED backlight module or other illumination devices. Whereby a light pattern that the luminous intensity of the paraxial zone thereof is lower than the luminous intensity of the off-axis zone thereof is formed; the light emission angle and uniformity of the light illumination are improved. Therefore, the present invention is able to improve the display quality, to reduce chromatic aberration and to meet the requirement of even light distribution, high scattering ability, becoming thinner, and effectively reduce the number of the LED light source device and thus reduce the volume of the LED backlight, the heat accumulation in the backlight module and costs.

According to the purpose of the present invention, an LED lens applied for a light source device of an LED backlight module or other illumination devices is provided, the light source device includes an LED and the LED lens disposed on an emitting surface of the LED. The LED lens comprises a light incident surface, a light emitting surface, and a bottom surface extending from the light incident surface and connected to the light emitting surface. The light emitting surface is an aspheric surface being symmetrical to an optical axis of the light source device, and includes a recession portion disposed at the center of the light emitting surface and a convex portion connected to the outer periphery of the recession portion. The recession portion of the light emitting surface may be a concave surface opposite to the light incident surface that is downward from the inner periphery of the convex portion and gradually perpendicular to the optical axis at the paraxial zone thereof. In another embodiment, the recession portion of the light emitting surface may be a concave surface opposite to the light incident surface that is downward from the inner periphery of the convex portion and has a small radius of curvature (said preferably |R|≤0.01 mm) at the intersection point with the optical axis. The light incident surface is a concave surface opposite to the light emitting surface and symmetrical to the optical axis, and it includes a first optically active area and a second optically active area. The first optically active area is disposed at the center of the light incident surface; the second optically active area is connected with the first optically active area and the bottom surface. An optical path inversion point is disposed at the junction between the first optically active area and the second optically active area. The LED lens satisfies the following condition (1): 0.71≥cos θ$_0$≥0.51. Wherein, θ$_0$ is the included angle between the optical axis and a connecting line from the optical path inversion point to the center of the emitting surface of the LED. When an included angle θ, which is the included angle between a connecting line from the center of the emitting surface of the LED to the arbitrary point on the light incident surface and the optical axis, is smaller than the included angle θ$_0$, a distance from the center of the emitting surface of the LED to the light incident surface decreases as the included angle θ increases; when the included angle θ is larger or equal to the included angle θ$_0$, the distance from the center of the emitting surface of the LED to the light incident surface increases or maintains a certain value as the angle θ increases.

Preferably, the LED lens might further satisfy the following condition (2), such that the LED lens of the present invention can further have proper refractive power to enhance light distribution uniformity of the light source device. If the LED lens meets the condition (2), the slope of the tangent of the optical path inversion point on the light incident surface can be controlled at an appropriate size, and the variance of degression of the distance from the center of the emitting surface of the LED to the light incident surface in the first optically active area can be controlled properly, too. Therefore, by satisfying the condition (2), the light refracted by the light incident surface would not be scattered excessively. Wherein, $\overline{OI_0}$ represents a connection length from the center of the emitting surface of the LED to the point of intersection between the light incident surface and the optical axis; and $\overline{OP_0}$ represents a distance from the center of the emitting surface of the LED to the optical path inversion point.

$$0.5 \le \frac{\overline{OP_0}}{\overline{OI_0}} \le 0.8 \qquad \text{condition(2)}$$

Preferably, the LED lens might further satisfy the following condition (3), such that the LED lens of the present invention can further have proper refractive power and control the diameter of a center darker region of a light pattern generated by the light source device at an appropriate size to enhance light distribution uniformity.

$$10 \le \frac{\tan\theta_e}{\tan\theta_k} \le 50 \qquad \text{condition(3)}$$

Wherein, θ$_e$ represents the included angle between the optical axis and a connecting line from the intersection point of the light emitting surface and the optical axis to an apex of the light emitting surface; θ$_k$ represents the included angle between the optical axis and a connecting line from the intersection point of the light incident surface and the optical axis to the optical path inversion point.

If the LED lens meets the condition (3), the curvature of the recession of the light emitting surface will be increased, and the curvature of the light incident surface will be decreased, such that the paraxial light would not be scattered excessively thereby achieving the effect of even light distribution.

Preferably, the LED lens might further satisfies the following condition (4), such that the LED lens of the present invention can further have proper refractive power to enhance light distribution uniformity of the light source device.

$$\frac{1}{3} \le \frac{L_3}{0.5 * R_E} \le \frac{1}{2} \qquad \text{condition (4)}$$

Wherein, $L_3$ represents a distance from the apex of the light emitting surface to the optical axis along a direction perpendicular to the optical axis; $R_E$ represents a diameter of the light emitting surface of the LED lens. If the LED lens meets the condition (4), that is, when $L_3$ is equal to or larger than ⅓ of ($0.5R_E$), the diameter of the recession of the light emitting surface will be increased, such that the light refracted by the recession of the light emitting surface can be scattered properly, and avoid the light excessively concentrating at the paraxial region. In addition, when $L_3$ is equal to or smaller than ½ of ($0.5R_E$), the diameter of the recession of the light emitting surface will be limited, such that the light refracted by the recession of the light emitting surface would not be scattered excessively thereby achieving the effect of even light distribution.

In a preferred embodiment, the first optically active area of the light incident surface is an aspherical surface; and the second optically active area is a spherical surface whose center is at the center of the emitting surface of the LED.

According to the purpose of the present invention, a light source device is further provided, which comprises the above mentioned LED lens and an LED. The LED is used to emit a light beam, and is provided with an emitting surface. Wherein, the light emitted from the LED enters the light-incident surface of the LED lens, then is transmitted through the LED lens, and ultimately is externally emitted from the light emitting surface of the LED lens, thereby forming a light pattern having a paraxial region (approximately corresponding to the viewing angle in a range of 0°~±10° with smaller luminous intensities than an off-axis region in the light pattern.

Preferably, the light source device might further satisfy the following condition (5), thereby modifying the light incident surface of the LED lens based on the diameter of the emitting surface of the LED that is proportional to the total luminous flux of the LED. Therefore, the LED lens and the light source device using the same can be further thinner and its light distribution uniformity can be improved.

$$0.7 \leq \frac{(0.5L + m' \cos\theta_c)}{\overline{OP_0} + \tan\theta_k} \leq 1 \quad \text{condition (5)}$$

Wherein, $\theta_k$ represents the included angle between the optical axis and a connecting line from the intersection point of the light incident surface and the optical axis to the optical path inversion point; L represents the diameter of the emitting surface of the LED; m' represents the shortest distance from the edge of the emitting surface of the LED to the optical path inversion point; $\theta_c$ represents the included angle between a connecting line from the edge of the emitting surface of the LED to the optical path inversion point and the plane where the emitting surface of the LED is located; and $\overline{OP_0}$ is the distance from the center of the emitting surface of the LED to the optical path inversion point.

In the light source device, there might be a gap between the plane where the bottom surface of the LED lens is located and the plane where the emitting surface of the LED is located. In different applications, said gap can be as 1 to 3 times of the thickness of light-emitting layer of the LED (approximately 0.1~0.3 mm) but not limited.

In the light source device, the light emitted from the LED is transmitted through media having lower refractive index than the refractive index of the LED lens, and then enters into the LED lens. In different applications, said media can be air, transparent silicone, or wavelength conversion component and so on but not limited.

By the above LED lens and the light source device using the same, one or more of the following advantages is obtained.

(1) By the present invention, a light pattern having a paraxial region with smaller luminous intensities than an off-axis region in the light pattern is generated, and thereby enhancing the light emission angle of the light source device. Therefore, the problem of a paraxial region with apparent bright area (ex. spot, stripe, or circle) in a light pattern generated by prior art, which used LED(s) as a light source, is prevented, and the color uniformity of the light source device is improved. In addition, the present invention is able to effectively reduce the number of the LED light source device and other elements for promoting even light distribution thus reduce the volume of the LED backlight, the heat accumulation in the backlight module and costs.

(2) Further, by the condition (5) of the present invention, the relationship among the position of the optical path inversion point, $\theta_k$ (relative to the shape of the first optically active area), and the radius of the emitting surface of the LED is provided preferably, such that the LED lens and the light source device using the same can be further thinner and its light distribution uniformity can be improved.

(3) Further, by the condition (2) of the present invention, the ratio of $\overline{OP_0}$ to $\overline{OI_0}$ is limited preferably, such that the preferably shape of the light incident surface is provided to have proper refractive power to enhance light distribution uniformity of the light source device.

(4) Further, by the condition (3) of the present invention, which is relative to the ratio of an approximate radius of curvature of the recession portion of the light emitting surface to an approximate radius of curvature of the first optically active area of the light incident surface, the relationship between the shape of the recession portion of the light emitting surface and the shape of the first optically active area of the light incident surface is provided preferably. Therefore, the LED lens of the present invention can further have proper refractive power and enhance light distribution uniformity of the light source device.

(5) Furthermore, by the condition (4), the position of the apex of the light emitting surface is limited preferably. Wherein, when $L_3$ is smaller than ⅓ of ($0.5R_E$), the luminous intensities in the paraxial region of a light pattern might be relatively increased, such that the light emission angle might be decreased and the light uniformity of the light source device might be decreased as the light pattern having bright rings. In addition, when $L_3$ is larger than ½ of ($0.5R_E$), the luminous intensities in the paraxial region of a light pattern might be relatively decreased so that the light pattern generated on a plate with a predetermined interval (ex. 22.5 mm) is prone to have bigger a center darker region and bright rings. Therefore, the LED lens of the present invention can further have proper refractive power to enhance light distribution uniformity of the light source device.

BRIEF DESCRIPTION OF THE DRAWINGS

The structure and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

The structure and technical features of the present invention will now be described with some preferred embodiments thereof and with reference to the accompanying drawings, so that the present invention can be best understood.

Figure 1:
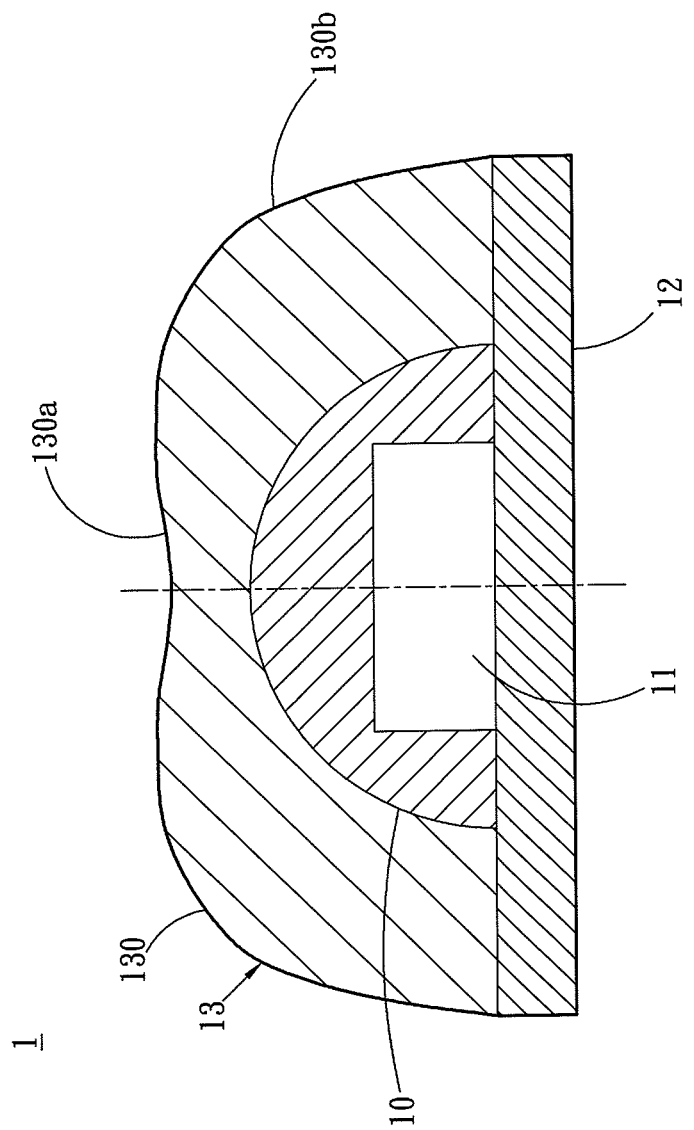
FIG. 1 is a cross-sectional view illustrating a conventional light source device.
Figure 2:
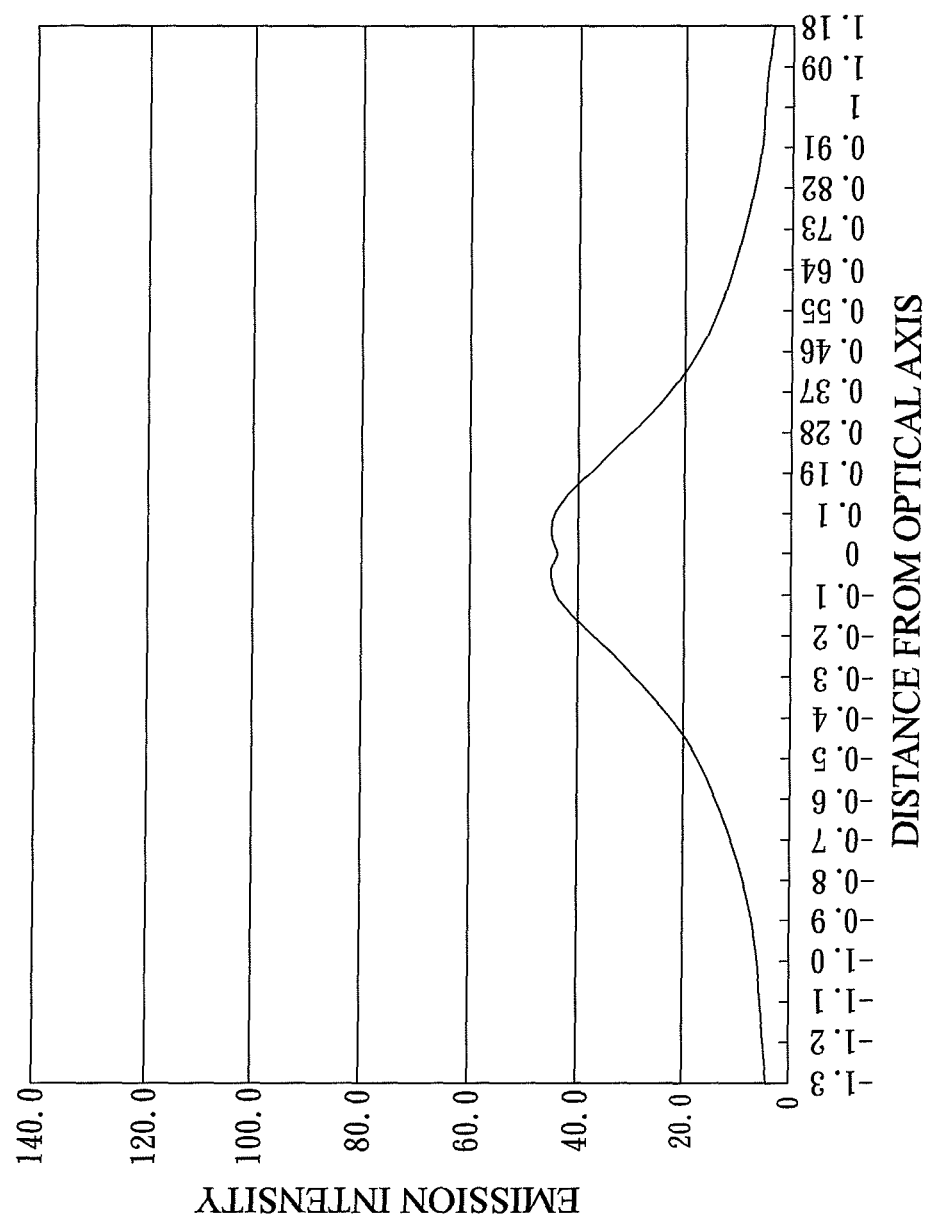
FIG. 2 is a diagram illustrating a distribution of emission intensity of a lens of the conventional light source device illustrated in FIG. 1.
Figure 3:
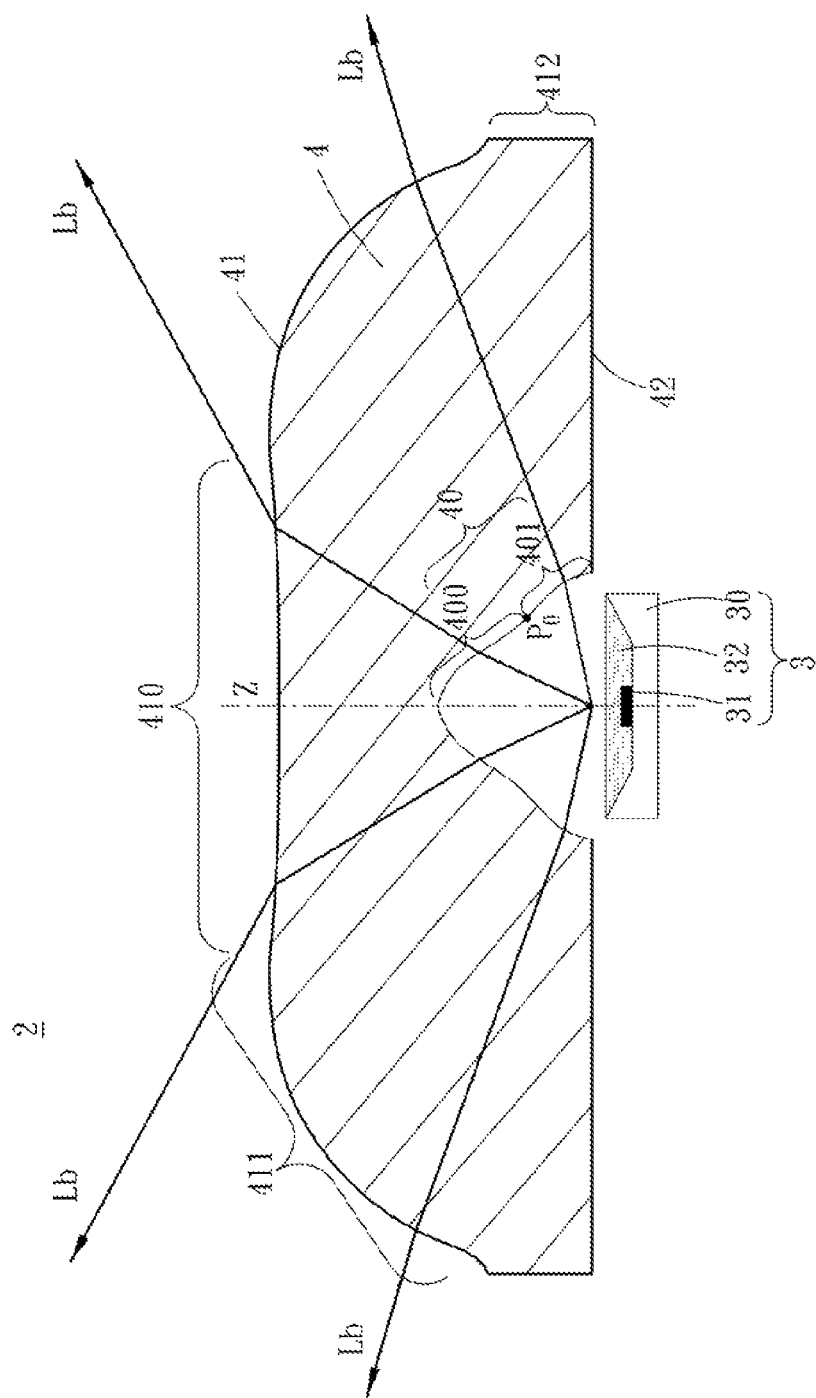
FIG. 3 is a cross-sectional view illustrating a light source device of the present invention.

Please refer to FIG. 3, it is a cross-sectional view illustrating a light source device comprising an LED lens of one embodiment of the present invention. The light source device 2 of the present invention is applied for an LED backlight module or other illumination device, it comprises an LED 3 and the LED lens 4. The LED 3 generally comprises but is not limited to, a substrate 30, an LED chip 31, and a fluorescent glue layer 32. The LED chip 31 can be disposed in a recession of the substrate 30, wherein the recession of the substrate 30 can be filled with the fluorescent glue layer 32 to cover and fix the LED chip 31 on the substrate 30, thereby the opening of the recession of the substrate 30 can be an emitting surface of the LED 3. Wherein, the material of the fluorescent glue layer 32 can be silicon oxide resin mixing with a wavelength conversion material such as phosphor. The LED lens 4 is disposed on the emitting surface of the LED 3, wherein an optical axis of the LED lens 4 is perpendicular to the emitting surface of the LED 3. For a more precise combined process, the optical axis of the LED lens 4 can pass through a geometric center of the emitting surface of the LED 3, such that the optical axis of the LED lens 4 is overlapped with an optical axis Z of the light source device 2. In the following embodiments, the optical axis of the LED lens 4 is overlapped with an optical axis Z of the light source device 2. The LED lens 4 is preferably made from transparent resin material or a transparent glass. Examples of such transparent resin material are polymethylmethacrylate (PMMA) having a refraction index of 1.49, polycarbonate (PC) having a refraction index of 1.59, epoxy resin (EP), polylactic acid (PLA) and the like. For cost savings, the LED lens 4 can be made from material having a refraction index of not less than 1.49 and not more than 1.53.

The LED lens 4 comprises a light incident surface 40, a light emitting surface 41, and a bottom surface 42 extending from the light incident surface 40 and connected to the light emitting surface 41. As shown in FIG. 3, the LED lens can refract the light Lb from the LED 3. In a preferred embodiment, the bottom surface 42 can be plated with a reflection layer or attached with material capable of reflecting light to enhance light utilization rate of the light source device 2. In the light source device 2, for helping heat dissipation more effective, there might be a gap between the plane where the bottom surface 42 of the LED lens 4 is located and the plane where the emitting surface of the LED 3 is located. For different applications, such gap between the bottom surface 42 and the emitting surface of the LED 3 can be filled with a media having lower refractive index than the refractive index of the LED lens 4. Examples of such media are air, transparent silicone, or wavelength conversion component and so on but not limited.

Figure 4:
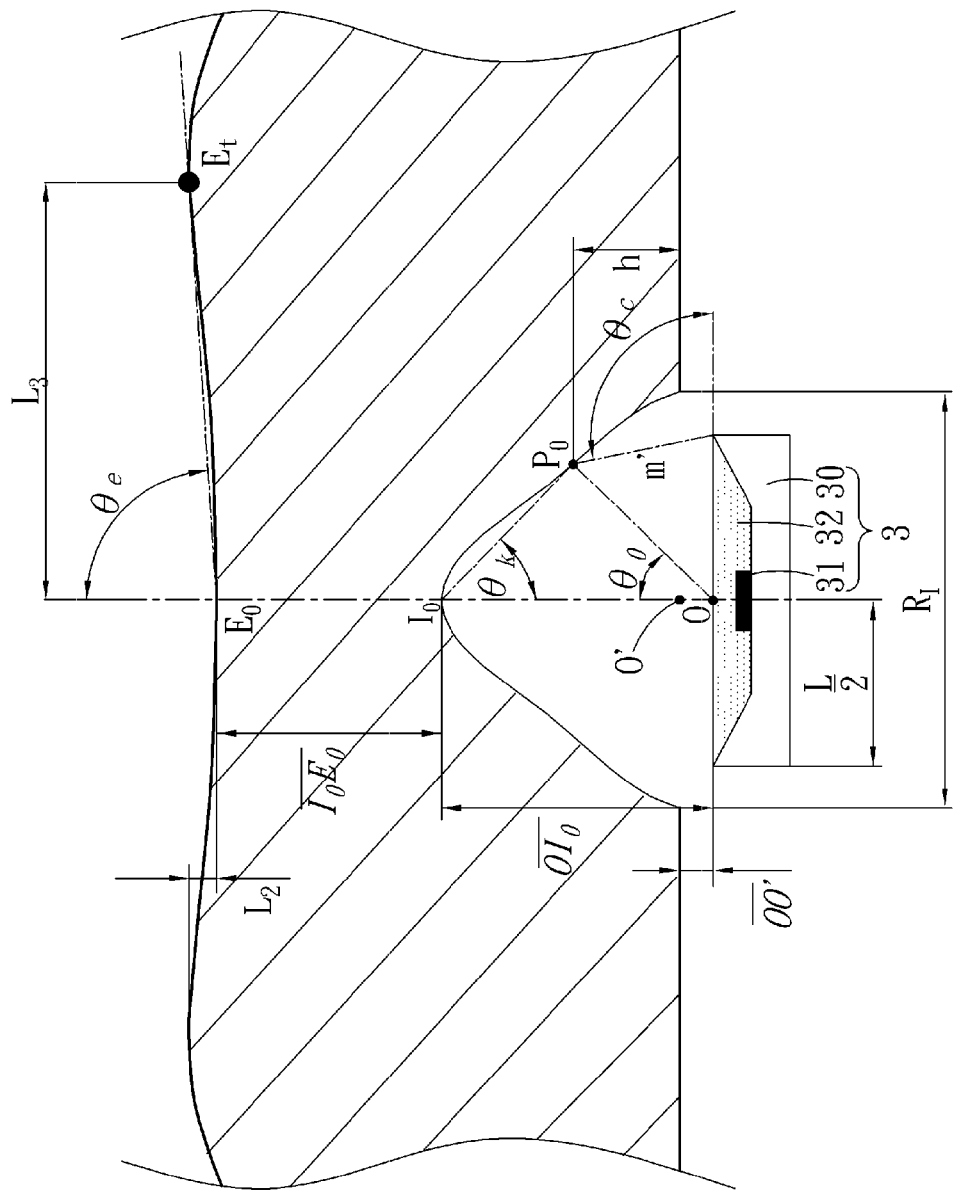
FIG. 4 is a local enlarged schematic view of FIG. 3.

The light emitting surface 41 of the LED lens 4 is an aspheric surface being symmetrical to the optical axis Z of the light source device 2, and includes a recession portion 410 disposed at the center of the light emitting surface 41 and a convex portion 411 connected to the outer periphery of the recession portion 410. In some embodiments, for helping prevent stray light, the light emitting surface 41 can further comprise a vertical portion 412, approximately parallel with the optical axis Z and connected to the outer periphery of the convex portion 411. Light Lb is further refracted toward the direction perpendicular to the optical axis Z by the recession portion 410, and thereby to decrease the luminous intensities in a paraxial region of a light pattern generated by the light source device 2 and to enhance the light emission angle. Please refer to FIGS. 3 and 4, the symbols related to the light emitting surface 41 are defined as follows:

$E_O$: the point of intersection between the optical axis Z and the recession portion 410 of the light emitting surface 41; $E_O$ is the center of the light emitting surface 41 for a preferred embodiment.

$E_r$: an apex of the light emitting surface 41 that is at a maximum distance from the plane of the emitting surface of the LED 3 along the direction parallel with optical axis Z; it also represents a junction between the recession portion 410 and the convex portion 411;

$L_3$: a distance from the apex ($E_r$) of the light emitting surface 41 to the optical axis Z along a direction perpendicular to the optical axis Z;

$R_E$: a diameter of the light emitting surface 41 of the LED lens 4;

$L_2$: a distance from the apex ($E_r$) of the light emitting surface 41 to a plane passing through $E_O$ and perpendicular to the optical axis Z along the direction parallel with optical axis Z;

$\theta_e$: the included angle between a connecting line from the point of intersection between the light emitting surface 41 and the optical axis Z to the apex ($E_r$) of the light emitting surface 41 and the optical axis Z.

The recession portion 410 of the light emitting surface 41 may be a concave surface opposite to the light incident surface 40 that is downward from the inner periphery of the convex portion 411. In some preferred embodiments, the curvature centers of the recession portion 410 can be located at the side of the light incident surface 40. Wherein, the recession portion 410 of the light emitting surface 41 may be gradually perpendicular to the optical axis Z at the paraxial zone thereof; in another embodiment, the recession portion 410 of the light emitting surface 41 may has a small radius of curvature (for example, $|R| \leq 0.01$ mm) at the intersection point with the optical axis Z.

Preferably, for further making the light emitting surface 41 of the LED lens 4 have proper refractive power to enhance light Lb being distributed more uniformly and prevent generation of bright ring simultaneously, the LED lens 4 might further satisfy the condition (4). Therefore, in a light pattern generated by the light source device 2, problems of apparent center darker region, which is too large or too dark when the ratio of $L_3$ to ($0.5*R_E$) is too high, or bright ring(s), which is caused when the ratio of $L_3$ to ($0.5*R_E$) is too low, is improved.

The light emitting surface 41 of the LED lens 4 of the present invention is an aspheric surface being symmetrical to the optical axis Z, in all embodiments of the present invention, the aspheric surfaces thereof are defined, but should not be limited to, by an aspheric surface formula as the following equation (6):

$$Z(h) = \frac{ch^2}{1 + \sqrt{(1 - (1+K)c^2h^2)}} + A_2h^2 + A_4h^4 + A_6h^6 + A_8h^8 + A_{10}h^{10} + A_{12}h^{12} + \quad \text{condition (6)}$$

wherein, Z(h) is the distance (SAG value) from any point on an optical surface of the lens to the tangential plane of the lens in the direction of the optical axis; c is the curvature of the optical surface on the optical axis; h is the distance (height) from any point on an optical surface of the lens to the optical axis along the direction perpendicular to the optical axis of the lens; K is the conic constant, and $A_2 \sim A_N$ are the $2^{th} \sim N^{th}$ order aspherical coefficients. However, it must be noted that the above mentioned aspheric surface formula is merely one of means to express the shape of an aspheric surface; any aspheric surface formula for defining an axially symmetrical aspheric surface should be available to use to define the aspheric surface(s) of the LED lens 4 of the present invention.

The light incident surface 40 of the LED lens 4 is a concave surface opposite to the light emitting surface 41 and symmetrical to the optical axis Z, and it includes a first optically active area 400 and a second optically active area 401. The first optically active area 400 is disposed at the center of the light incident surface 40 and can be an aspheric surface. The second optically active area 401 is connected with the first optically active area 400 and the bottom surface 42, and it can be an aspheric surface or a spherical surface whose center coincides with at the center of the emitting surface O of the LED 3. Thereby, light Lb can be refracted differently so as to improve the light emission angle and the light distribution uniformity of the light source device 2 by the first optically active area 400 and the second optically active area 401 according to the shapes of the first optically active area 400 and the second optically active area 401 and the Snell's law. In a preferred embodiment, to further enhance the light distribution uniformity of the light pattern generated by the light source device 2, the second optically active area 401 can have a microstructure. For example, the second optically active area 401 can be sandblasted so that light emitted from the sandblasted surface will be distributed more uniformly and the center darker region of the light pattern is compensated with light.

Figure 5:
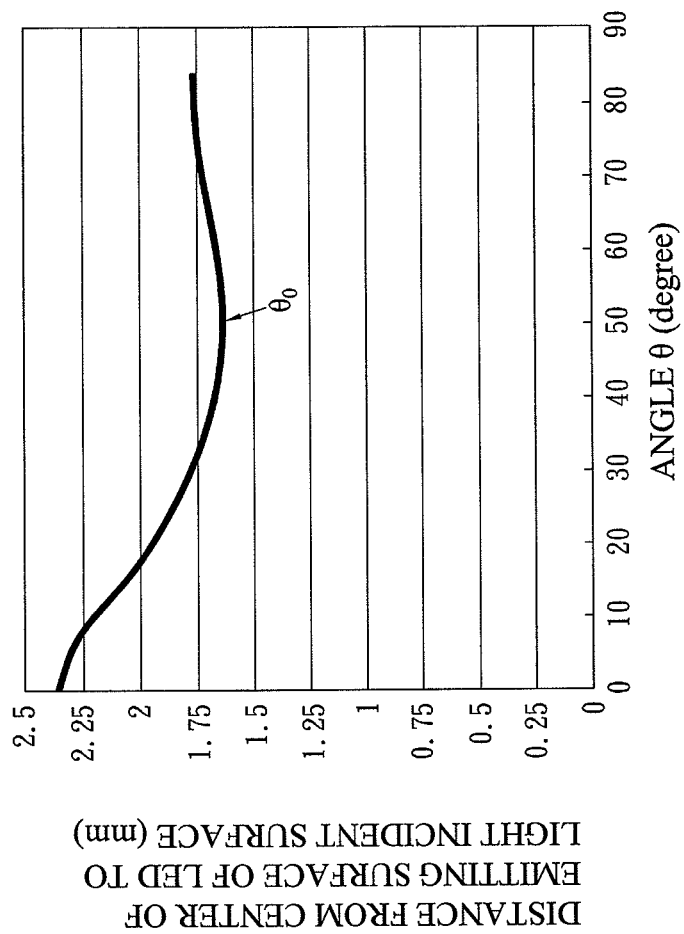
FIG. 5 is a diagram showing a relation between the included angle θ and the corresponding distance from the center of the emitting surface of the LED to the arbitrary point on the light incident surface in an embodiment of the light source device of the present invention.
Figure 6:
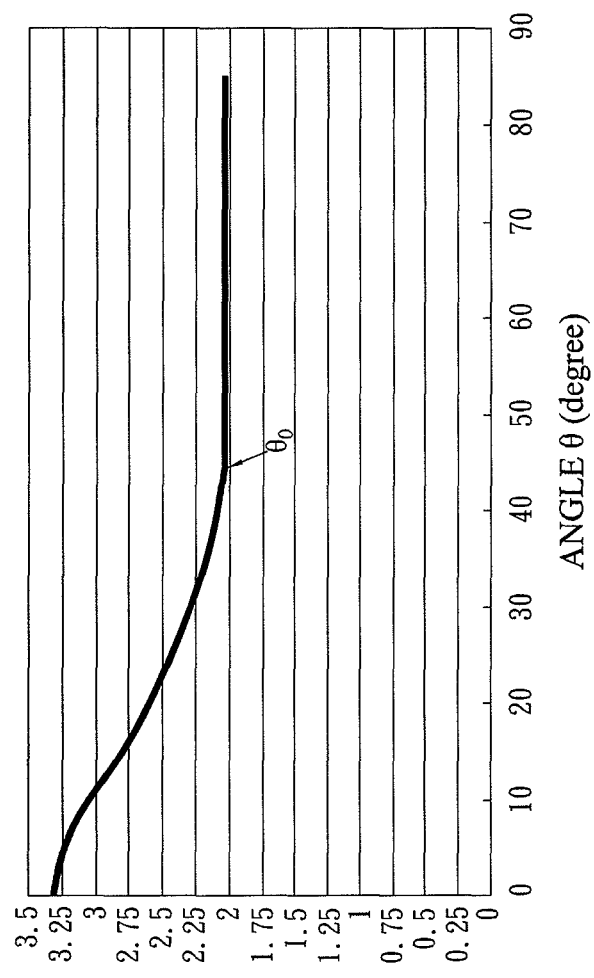
FIG. 6 is a diagram showing a relation between the included angle θ and the corresponding distance from the center of the emitting surface of the LED to the arbitrary point on the light incident surface in other embodiment of the light source device of the present invention.
Figure 8:
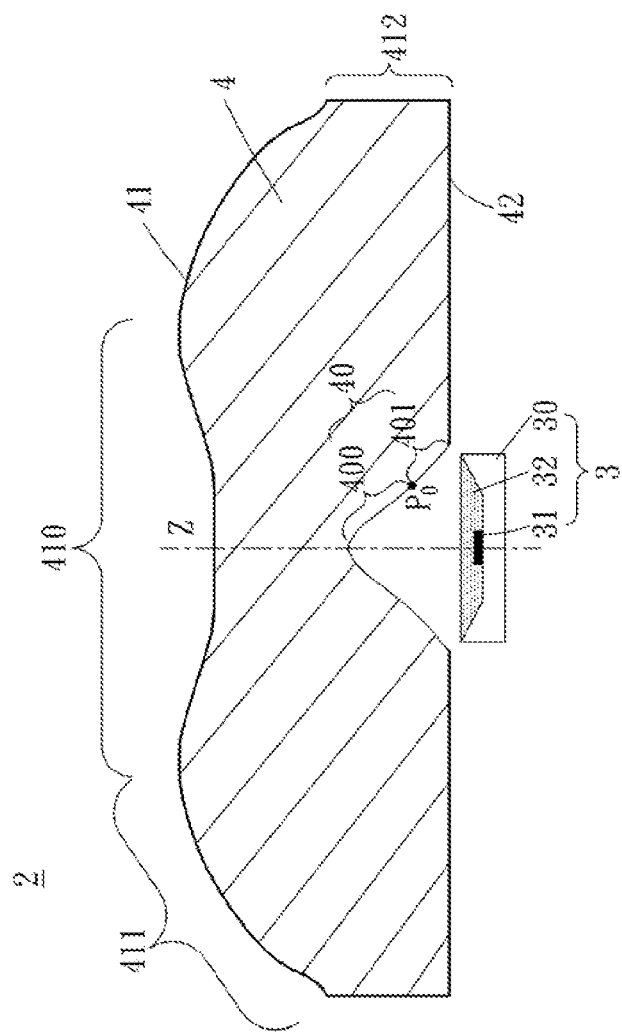
FIG. 8 is a cross-sectional view illustrating a light source device of the present invention according to the first embodiment thereof.

Wherein, the diameter of the opening $R_I$ formed by the light incident surface 40 and corresponding to the LED 3 might be slightly larger than the diameter of the substrate 30. For enhancing the light emission angle of the light source device 2, light Lb emitted from the LED 3 is transmitted through media having lower refractive index than the refractive index of the LED lens, and then is sequentially incident to the light incident surface 40 and the light emitting surface 41 of the LED lens 4. In different applications, said media can be air, transparent silicone, or wavelength conversion component and so on but not limited. To facilitate comparison, said media having lower refractive index is air in each of the following embodiments. In different applications, the second optically active area 401 of the light incident surface 40 can be a concave surface corresponding to the center of the emitting surface O of the LED 3 as the FIG. 3 shown; in addition, the second optically active area 401 of the light incident surface 40 also can be a convex surface corresponding to the center of the emitting surface O of the LED 3 as the FIG. 8 shown In the light incident surface 40 of the LED lens 4, an optical path inversion point $P_0$ is disposed at the junction between the first optically active area 400 and the second optically active area 401. Wherein, an included angle $\theta_0$ is between a connecting line from the optical path inversion point $P_0$ to the center of the emitting surface O of the LED 3 and the optical axis Z; an included angle $\theta$ is the included angle between a connecting line from the center of the emitting surface O of the LED 3 to the arbitrary point on the light incident surface 40 and the optical axis Z. Distances from the center of the emitting surface O of the LED 3 to the light incident surface 40 decrease as the included angle $\theta$ increases in the range of $\theta < \theta_0$. Distances from the center of the emitting surface O of the LED to the light incident surface 40 increase (as shown in FIG. 5) or maintains a certain value (as shown in FIG. 6) as the angle θ increases in the range of θ≥θ$_0$.

In order to achieve the purpose of the present invention, that is, providing an LED lens and a light source device with improved uniformity of the light illumination and at least 120° of light emission angle, the LED lens 4 satisfies the condition (1) so as to limit the position of the optical path inversion point P$_0$ at the light incident surface 40. Wherein, the value of cos θ$_0$ can be deducted from the following condition (7), therefore, the condition (1) of the present invention also provides the relationship among $\overline{OI_0}$, θ$_k$, L, m', θ$_c$, and $\overline{OP_0}$ to demonstrate the shape of the light incident surface 40 so as to facilitate the production of the LED lens 4 of the present invention.

$$\cos\theta_0 = \frac{\overline{OI_0} * \tan\theta_k - (0.5L + m'\cos\theta_c)}{\overline{OP_0} * \tan\theta_k} \quad \text{condition (7)}$$

Please refer to FIGS. 3 and 4 again, the symbols related to the light incident surface 40 and the condition (7) are defined as follows:

$\overline{OI_0}$: a connection length from the center of the emitting surface O of the LED 3 to the point of intersection between the light incident surface 40 and the optical axis Z;

θ$_k$: represents the included angle between the optical axis Z and a connecting line from the intersection point of the light incident surface 40 and the optical axis Z to the optical path inversion point P$_0$;

L: the diameter of the emitting surface of the LED 3;

m': the shortest distance from the edge of the emitting surface of the LED 3 to the optical path inversion point P$_0$;

θ$_c$: the included angle between a connecting line from the edge of the emitting surface of the LED 3 to the optical path inversion point P$_0$ and the plane where the emitting surface of the LED 3 is located;

$\overline{OO'}$: the distance from the center of the emitting surface O of the LED 3 to the opening center of the recession formed by the light incident surface 40 O' corresponding to the LED 3; and $\overline{OP_0}$: the distance from the center of the emitting surface O of the LED 3 to the optical path inversion point P$_0$.

Figure 7A:
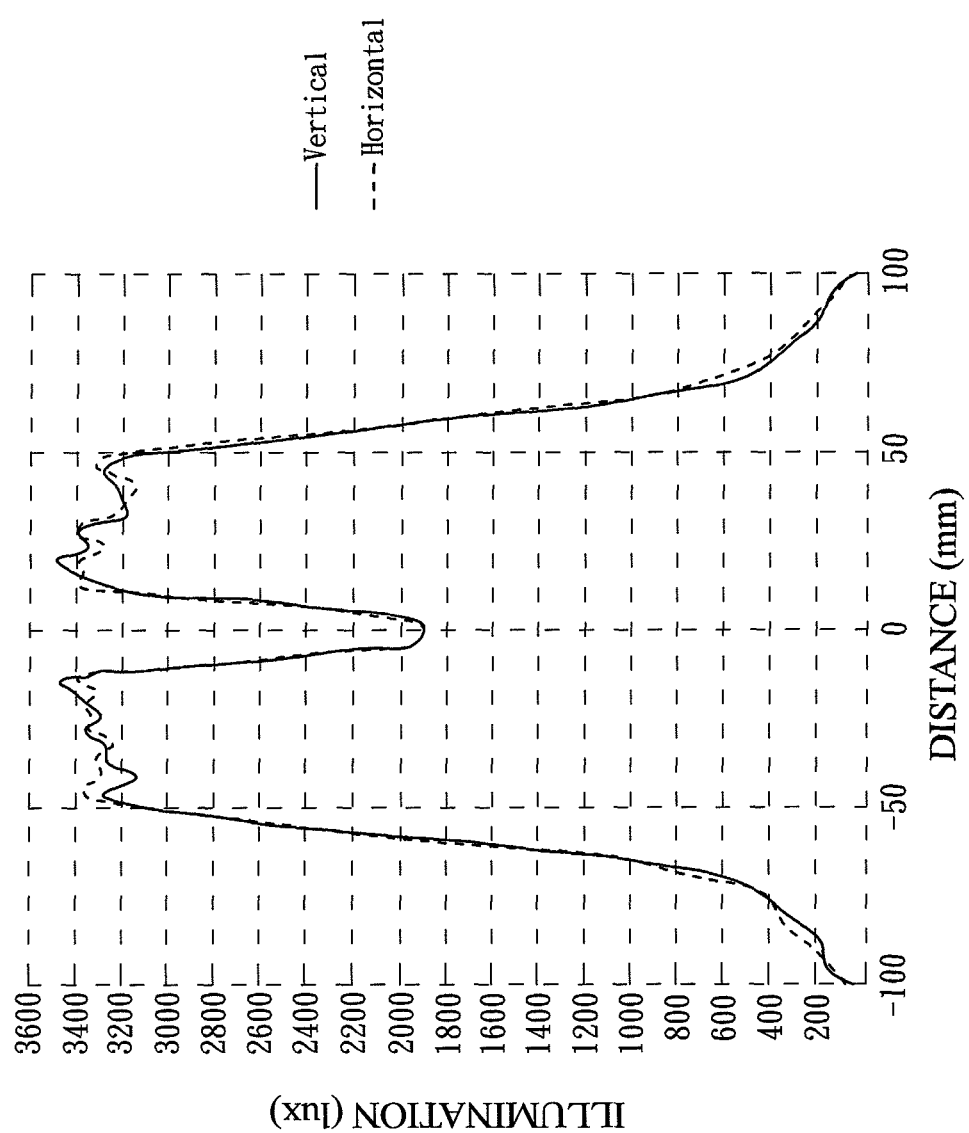
FIG. 7A is diagram showing an illumination curve on a sheet irradiated by the light source device of the present invention.
Figure 7B:
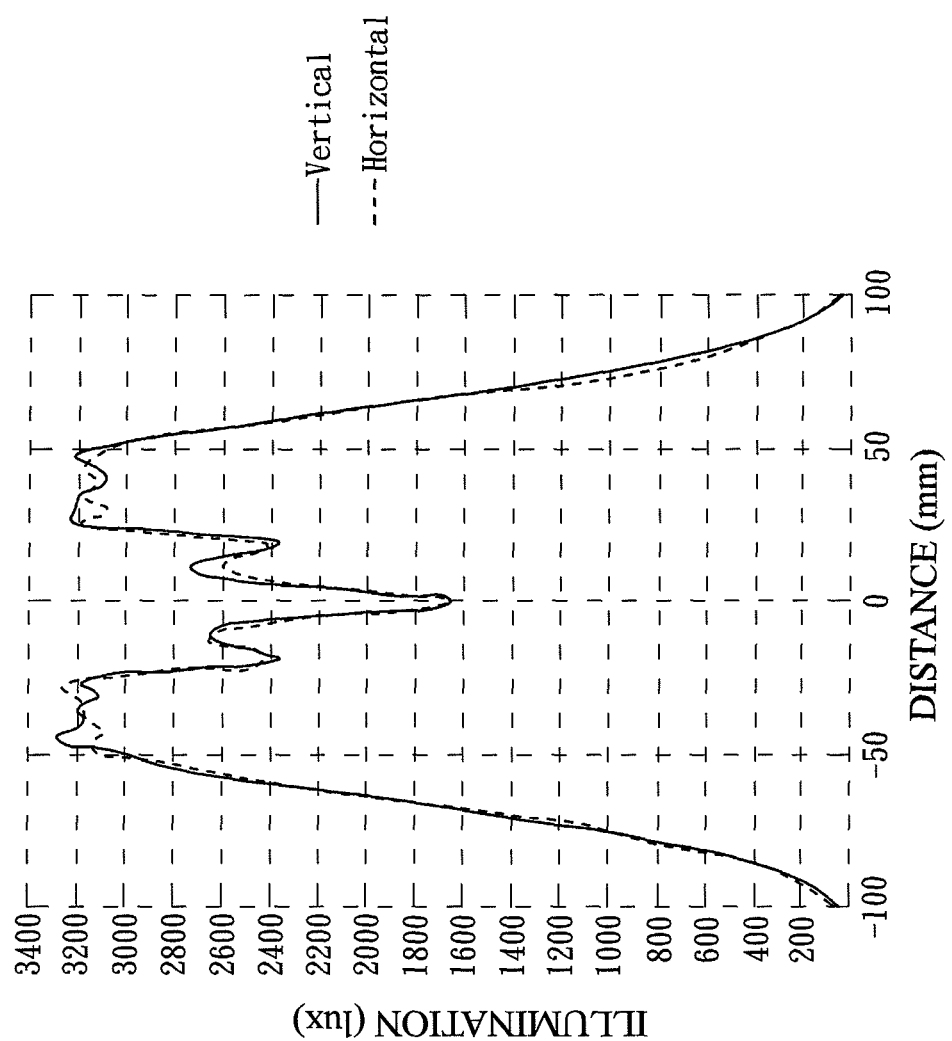
FIG. 7B is diagram showing an illumination curve on a sheet irradiated by the conventional light source device.

Please refer to FIG. 7A, it is a diagram showing an illumination curve on a sheet with a size of 100 mm×100 mm irradiated by the light source device 2 of the present invention with an interval of 22.5 mm. Further, FIG. 7B is diagram showing an illumination curve on said sheet irradiated by the conventional light source device with the same condition as in FIG. 7A. Compared with the conventional light source device, under the same condition, the light source device 2 of the present invention provides more uniform illumination; and the diameter of the center darker region (which is approximately the interval between two peaks of illumination with a center at the optical axis Z) of the light pattern generated by the light source device 2 of the present invention is smaller and more appropriate to facilitate use in the thinner display device.

In a preferred embodiment, for further making the LED lens 2 and the light source device 4 be more thinner, and making the size of the center darker region of the light pattern generated by the light source device 2 be controlled properly, thereby reducing chromatic aberration and enhance light distribution uniformity of the light source device 2, the LED lens 4 can further satisfy the condition (5) so as to adjust the position of the optical path inversion point P$_0$ and the θ$_k$, which is a symbol for the shape of the first optically active area 400, based on a predetermined diameter of the emitting surface of the LED 3.

In a preferred embodiment, for further making the LED lens 4 has proper refractive power to enhance light distribution uniformity of the light source device 2, the LED lens 4 can further satisfy the condition (2) so as to limit the range of the ratio of $\overline{OP_0}$ to $\overline{OI_0}$ thereby providing the preferably shape of the light incident surface 40 to facilitate the production of the LED lens 4 of the present invention.

In a preferred embodiment, to further make the light source device 2 of the present invention can be applied to the thinner display device, in the present invention, distances from the arbitrary point on the light emitting surface 41 to the light incident surface 40 or the bottom surface 42 along the direction of the optical axis Z are smaller or equal to 5 mm.

In a preferred embodiment, the LED lens 4 can further satisfy the following condition (3), which is provided the preferably relationship between the shape of the recession portion 411 of the light emitting surface 41 and the shape of the first optically active area 400 of the light incident surface 40. Therefore, the LED lens 4 of the present invention can further have proper refractive power to uniformly distribute the light without glare or hot spots, and control a center darker region of a light pattern generated by the light source device 2 at an appropriate size and appropriate luminous intensity to enhance light distribution uniformity.

To illustrate the various embodiments derived according to the main technical feature of the present invention, seven types of LED lenses are following listed; however, data about various distances, various angles, size, coefficients (factor), or material and so on according to the light source device 2 listed below is only provided for description purpose and should not be used to limit the range of the present invention. In each following embodiment, the diameter of the emitting surface of the LED 3 (L) is 2.1 mm; and the distance from the center of the emitting surface O of the LED 3 to the opening center of the recession formed by the light incident surface 40 O' ($\overline{OO'}$) is 0.2 mm.

<First Embodiment>

Figure 9:
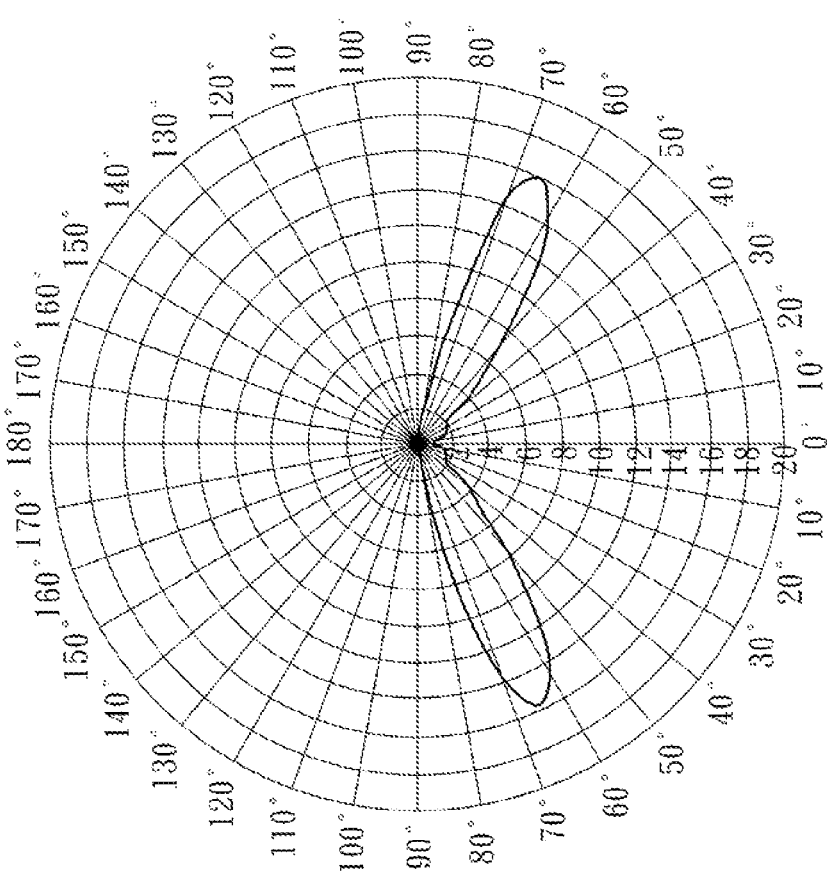
FIG. 9 is a polar candela distribution plot of a light source device of the present invention according to the first embodiment thereof.

Please refer to FIGS. 8 and 9, they are a cross-sectional view illustrating a light source device of the present invention according to the first embodiment thereof and a polar candela distribution plot thereof, respectively.

In the Table (1) listed below, there are shown the coefficients of the aspheric surface formula (6) constituting the light emitting surface 41 of the LED lens 4 in the first embodiment:

TABLE (1)

| c | K | $A_2$ | $A_4$ | $A_6$ |
|---|---|---|---|---|
| 0.01 | 10 | −8.188E−03 | 2.345E−02 | −3.123E−03 |
| $A_8$ | $A_{10}$ | $A_{12}$ | $A_{14}$ | $A_{16}$ |
| 1.865E−04 | −6.214E−06 | 1.187E−07 | −1.215E−09 | 5.164E−12 |

In the Table (2) listed below, there are shown data referred to FIG. 5 and the refractive index ($N_d$) of the LED lens 4 in the first embodiment:

TABLE (2)

| $\cos\theta_0$ | $\overline{OI_0}$ (mm) | $\overline{OP_0}$ (mm) | $\tan\theta_k$ | m' (mm) | $\cos\theta_c$ | $\tan\theta_e$ |
|---|---|---|---|---|---|---|
| 0.668 | 1.869 | 1.341 | 1.025 | 0.897 | −0.059 | 6.224 |

TABLE (2)-continued

| $L_3$ (mm) | $R_E$ (mm) | h (mm) | $R_I$ (mm) | $\overline{I_0E_0}$ (mm) | $L_2$ (mm) | $N_d$ |
|---|---|---|---|---|---|---|
| 3.615 | 15.000 | 0.696 | 3.500 | 2.199 | 0.581 | 1.490 |

In the first embodiment, the LED lens 4 is made from PMMA having a refraction index of 1.49. The effective divergence angle of the light source device 2 using the LED lens 4 is about 150°. An included angle between a connecting line from the center of the emitting surface of the LED 3 to the peak of the luminous intensity of a light pattern and the optical axis Z is about 66°. Wherein, the effective divergence angle is defined by double of the critical angle corresponding to the half of maximum luminous intensity. The position of the optical path inversion point $P_0$ at the light incident surface 40 satisfies the condition (1). In this embodiment, distances from the center of the emitting surface O of the LED 3 to the light incident surface 40 decrease as the included angle θ increases in the range of θ<48°. Distances from the center of the emitting surface O of the LED to the light incident surface 40 increase as the angle θ increases in the range of θ≥48°. The second optically active area 401 of the light incident surface 40 is a convex surface corresponding to the LED 3. The others main technical features about the light incident surface 40 and the light emitting surface 41 according to the LED lens 4 of the present invention are disclosed in the previous paragraphs, therefore the same description about the LED lens 4 is omitted herein.

In the first embodiment, the values of the conditions (2)~(5) are calculated and shown following.

$$\frac{\overline{OP_0}}{\overline{OI_0}} = 0.717$$

$$\frac{\tan\theta_e}{\tan\theta_k} = 6.072$$

$$\frac{L_3}{0.5 * R_E} = 0.482$$

$$\frac{(0.5L + m'\cos\theta_c)}{\overline{OP_0} * \tan\theta_k} = 0.726$$

Therefore, the LED lens 4 of this embodiment satisfies the conditions (2), (4), (5). However, because the depth of recession portion 410 of the light emitting surface 41 thereof is greater, the light Lb is apt to be totally reflected by the recession portion 410, thereby decreasing light utilization efficiency. In addition, since the ratio of tan $\theta_e$ to tan $\theta_k$ is smaller than the lower limit of the condition (3), the effective divergence angle of the light source device 2 according to the first embodiment is smaller and the diameter of the center darker region of the light pattern generated by the light source device 2 is larger than the others LED lenses 4 satisfying the condition (3). Therefore, a second embodiment and a third embodiment with better results are disclosed according to the amendment of the first embodiment.

<Second Embodiment>

Figure 10:
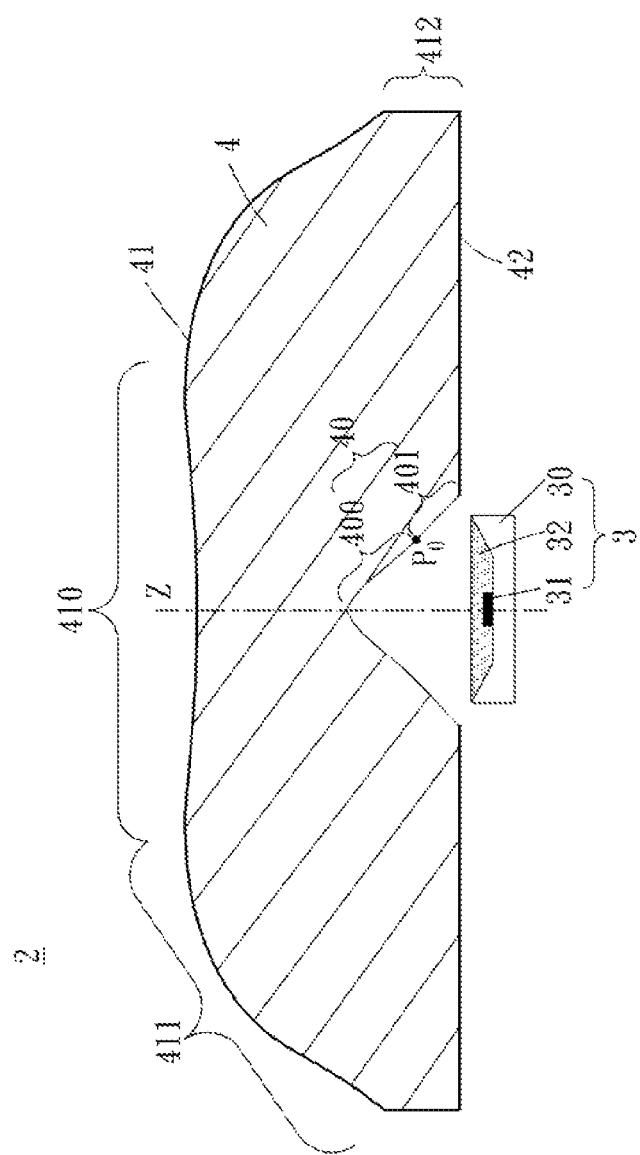
FIG. 10 is a cross-sectional view illustrating a light source device of the present invention according to the second embodiment thereof.
Figure 11:
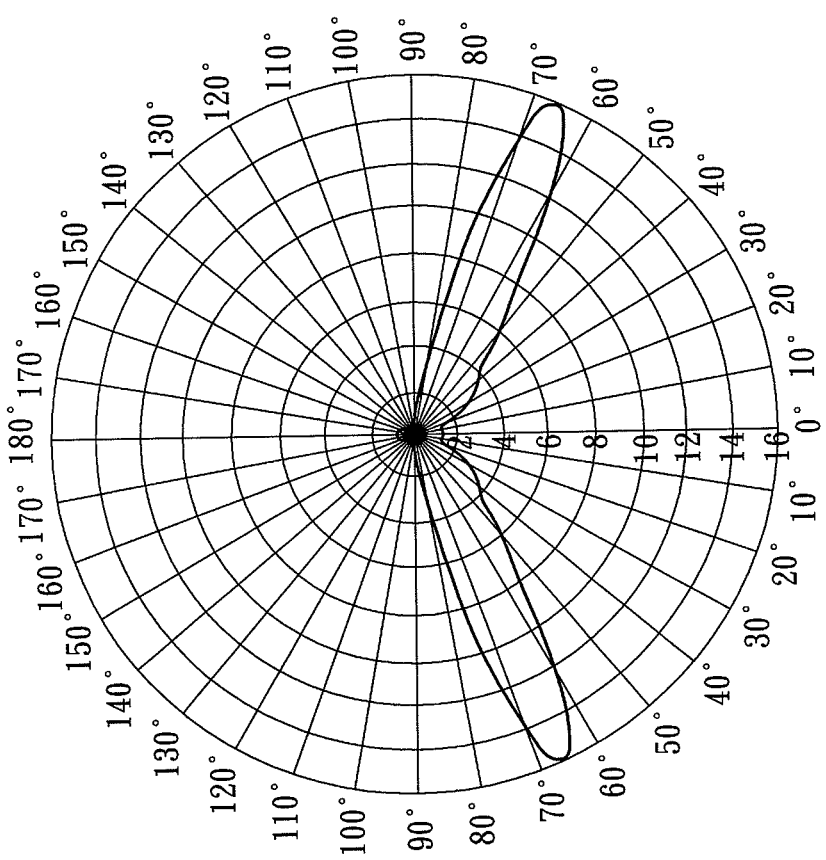
FIG. 11 is a polar candela distribution plot of a light source device of the present invention according to the second embodiment thereof.

Please refer to FIGS. 10 and 11, they are a cross-sectional view illustrating a light source device of the present invention according to the second embodiment thereof and a polar candela distribution plot thereof, respectively.

In the Table (3) listed below, there are shown the coefficients of the aspheric surface formula (6) constituting the light emitting surface 41 of the LED lens 4 in the second embodiment:

TABLE (3)

| c | K | $A_2$ | $A_4$ | $A_6$ |
|---|---|---|---|---|
| −6.418E+12 | −4.504E+04 | 1.561E−02 | 2.308E−03 | −2.770E−04 |

| $A_8$ | $A_{10}$ | $A_{12}$ | $A_{14}$ |
|---|---|---|---|
| 8.028E−06 | −4.706E−08 | −1.562E−09 | 1.907E−11 |

In the Table (4) listed below, there are shown data referred to FIG. 5 and the refractive index ($N_d$) of the LED lens 4 in the second embodiment:

TABLE (4)

| $\cos\theta_0$ | $\overline{OI_0}$ (mm) | $\overline{OP_0}$ (mm) | $\tan\theta_k$ | m' (mm) | $\cos\theta_c$ | $\tan\theta_e$ |
|---|---|---|---|---|---|---|
| 0.668 | 1.869 | 1.341 | 1.025 | 0.897 | −0.059 | 19.559 |

| $L_3$ (mm) | $R_E$ (mm) | h (mm) | $R_I$ (mm) | $\overline{I_0E_0}$ (mm) | $L_2$ (mm) | $N_d$ |
|---|---|---|---|---|---|---|
| 3.435 | 15 | 0.696 | 3.5 | 2.199 | 0.176 | 1.49 |

In the second embodiment, the LED lens 4 is made from PMMA having a refraction index of 1.49. The effective divergence angle of the light source device 2 using the LED lens 4 is about 150°. An included angle between a connecting line from the center of the emitting surface of the LED 3 to the peak of the luminous intensity of a light pattern and the optical axis Z is about 67°. The position of the optical path inversion point $P_0$ at the light incident surface 40 satisfies the condition (1). In this embodiment, distances from the center of the emitting surface O of the LED 3 to the light incident surface 40 decrease as the included angle θ increases in the range of θ<48°. Distances from the center of the emitting surface O of the LED to the light incident surface 40 increase as the angle θ increases in the range of θ≥48°. The second optically active area 401 of the light incident surface 40 is a convex surface corresponding to the LED 3. The others main technical features about the light incident surface 40 and the light emitting surface 41 according to the LED lens 4 of the present invention are disclosed in the previous paragraphs, therefore the same description about the LED lens 4 is omitted herein.

In the second embodiment, the values of the conditions (2)~(5) are calculated and shown following.

$$\frac{\overline{OP_0}}{\overline{OI_0}} = 0.717$$

$$\frac{\tan\theta_e}{\tan\theta_k} = 19.082$$

$$\frac{L_3}{0.5 * R_E} = 0.458$$

$$\frac{(0.5L + m'\cos\theta_c)}{\overline{OP_0} * \tan\theta_k} = 0.726$$

<Third Embodiment>

Figure 12:
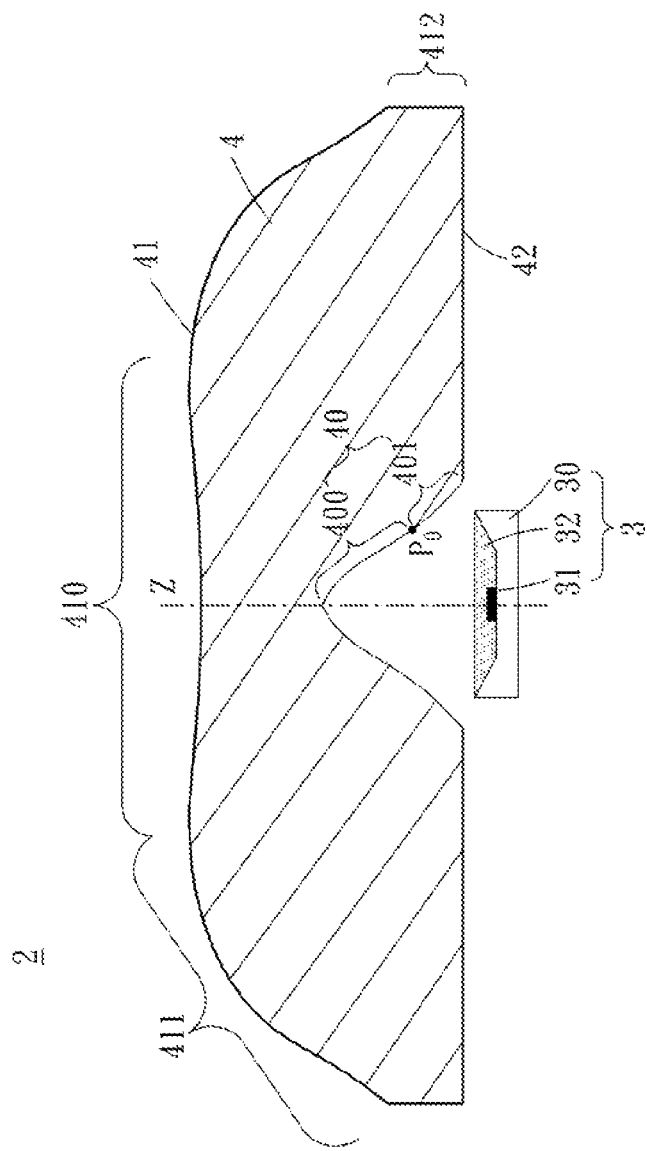
FIG. 12 is a cross-sectional view illustrating a light source device of the present invention according to the third embodiment thereof.
Figure 13:
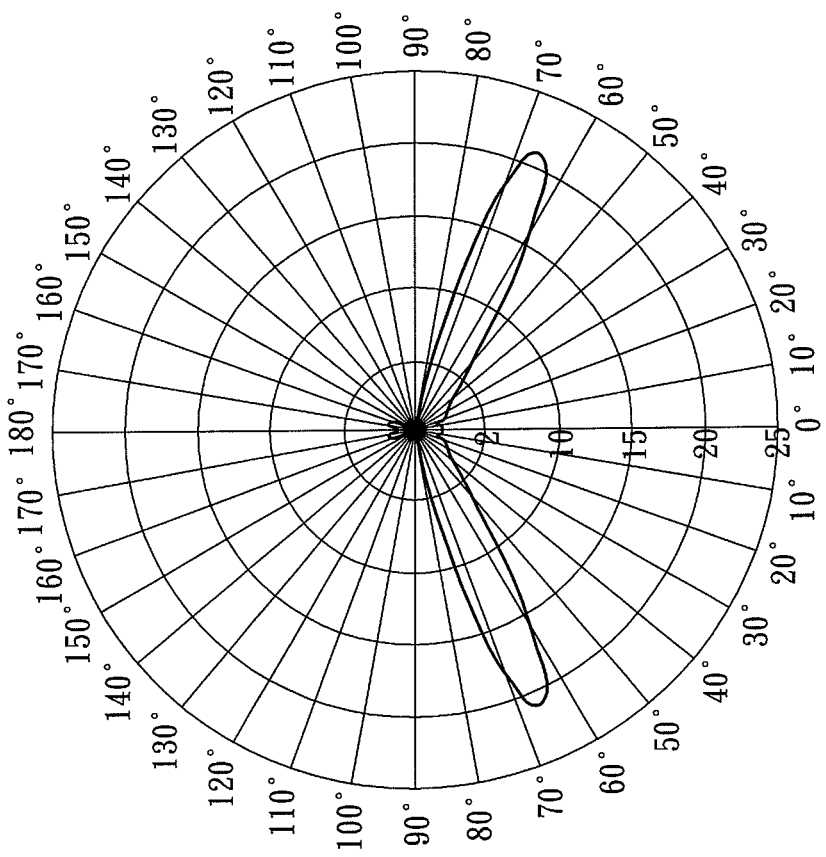
FIG. 13 is a polar candela distribution plot of a light source device of the present invention according to the third embodiment thereof.

Please refer to FIGS. 12 and 13, they are a cross-sectional view illustrating a light source device of the present invention according to the third embodiment thereof and a polar candela distribution plot thereof, respectively.

In the Table (5) listed below, there are shown the coefficients of the aspheric surface formula (6) constituting the light emitting surface 41 of the LED lens 4 in the third embodiment:

TABLE (5)

| c | K | $A_2$ | $A_4$ | $A_6$ |
|---|---|---|---|---|
| −6.418E+12 | −2.975E+04 | 1.957E−02 | 2.253E−03 | −2.770E−04 |

| $A_8$ | $A_{10}$ | $A_{12}$ | $A_{14}$ |
|---|---|---|---|
| 8.017E−06 | −4.706E−08 | −1.562E−09 | 1.907E−11 |

In the Table (6) listed below, there are shown data referred to FIG. 5 and the refractive index ($N_d$) of the LED lens 4 in the third embodiment:

TABLE (6)

| $\cos\theta_0$ | $\overline{OI_0}$ (mm) | $\overline{OP_0}$ (mm) | $\tan\theta_k$ | m' (mm) | $\cos\theta_c$ | $\tan\theta_e$ |
|---|---|---|---|---|---|---|
| 0.605 | 2.300 | 1.598 | 0.955 | 0.993 | 0.224 | 16.664 |

| $L_3$ (mm) | $R_E$ (mm) | h (mm) | $R_I$ (mm) | $\overline{I_0 E_0}$ (mm) | $L_2$ (mm) | $N_d$ |
|---|---|---|---|---|---|---|
| 3.524 | 14.80 | 0.767 | 3.8 | 1.9 | 0.211 | 1.51 |

In the third embodiment, the LED lens 4 is made from transparent resin material having a refraction index of 1.51. The effective divergence angle of the light source device 2 using the LED lens 4 is about 150°. An included angle between a connecting line from the center of the emitting surface of the LED 3 to the peak of the luminous intensity of a light pattern and the optical axis Z is about 68°. The position of the optical path inversion point $P_0$ at the light incident surface 40 satisfies the condition (1). In this embodiment, distances from the center of the emitting surface O of the LED 3 to the light incident surface 40 decrease as the included angle θ increases in the range of θ0<52.7°. Distances from the center of the emitting surface O of the LED to the light incident surface 40 increase as the angle θ increases in the range of θ≥52.7°. The second optically active area 401 of the light incident surface 40 is a convex surface corresponding to the LED 3. The others main technical features about the light incident surface 40 and the light emitting surface 41 according to the LED lens 4 of the present invention are disclosed in the previous paragraphs, therefore the same description about the LED lens 4 is omitted herein.

In the third embodiment, the values of the conditions (2)~(5) are calculated and shown following.

$$\frac{\overline{OP_0}}{\overline{OI_0}} = 0.695$$

$$\frac{\tan\theta_e}{\tan\theta_k} = 17.451$$

$$\frac{L_3}{0.5 * R_E} = 0.476$$

$$\frac{(0.5L + m'\cos\theta_c)}{\overline{OP_0} * \tan\theta_k} = 0.834$$

Therefore, the second and third embodiments satisfy the conditions (2)~(5), respectively. Whereby a light distribution that the luminous intensity of the paraxial zone thereof is lower than the luminous intensity of the off-axis zone thereof is formed, and thereby enhancing the light emission angle of the light source device 2. Therefore, the problem of a paraxial region with apparent bright area (ex. spot, stripe, or circle) in a light pattern generated by prior art, which used LED(s) as a light source, is prevented, and the color uniformity of the light source device is improved. Further, because the depth of recession portion 410 of the light emitting surface 41 thereof is smaller, which is corresponding to the larger tame, the light Lb is not apt to be totally reflected by the recession portion 410, thereby enhancing the refractive power of the light emitting surface 41 with the requirement of maintaining light utilization efficiency. In addition, the size of the center darker region of the light pattern generated by the light source device 2 is smaller and appropriate, so that the light distribution uniformity of the light source device 2 can be improved.

<Fourth Embodiment>

Figure 14:
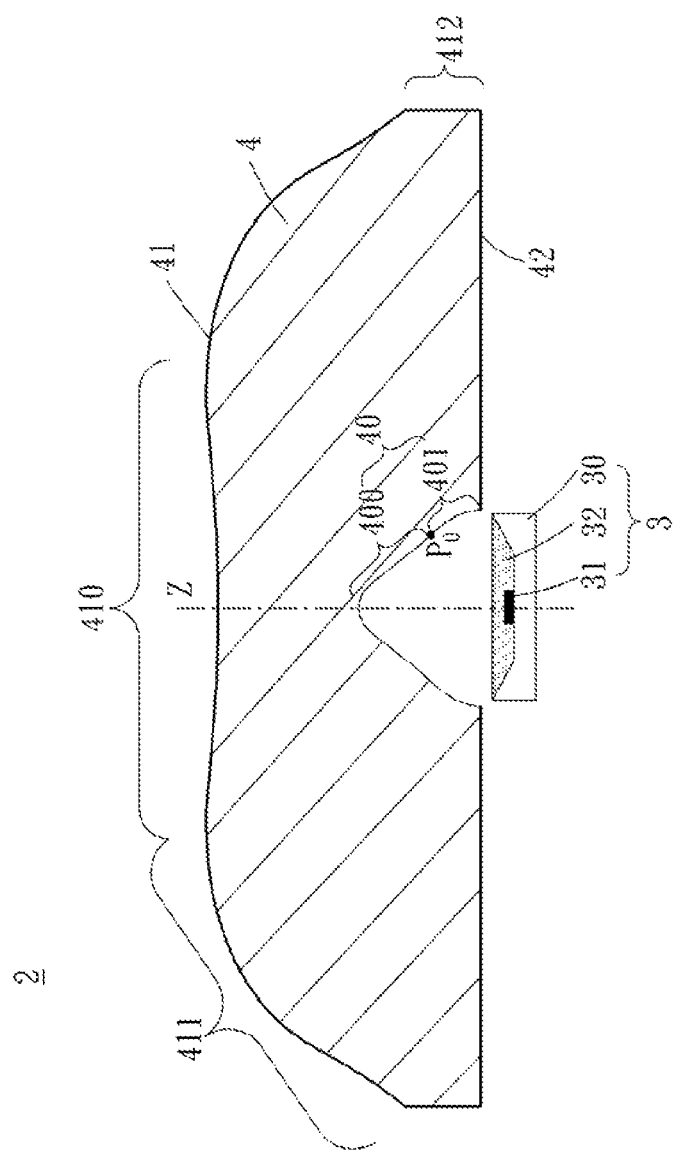
FIG. 14 is a cross-sectional view illustrating a light source device of the present invention according to the fourth embodiment thereof.
Figure 15:
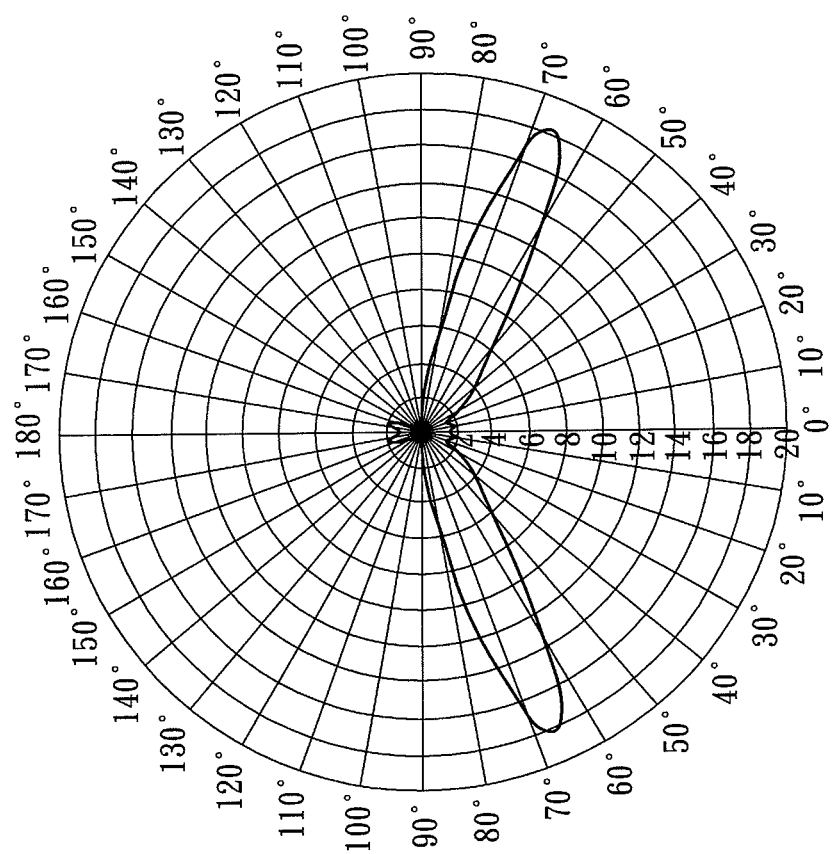
FIG. 15 is a polar candela distribution plot of a light source device of the present invention according to the fourth embodiment thereof.

Please refer to FIGS. 14 and 15, they are a cross-sectional view illustrating a light source device of the present invention according to the fourth embodiment thereof and a polar candela distribution plot thereof, respectively.

In the Table (7) listed below, there are shown the coefficients of the aspheric surface formula (6) constituting the light emitting surface 41 of the LED lens 4 in the fourth embodiment:

TABLE (7)

| c | K | $A_2$ | $A_4$ | $A_6$ |
|---|---|---|---|---|
| −6.418E+12 | −2.975E+04 | 1.957E−02 | 2.253E−03 | −2.770E−04 |

| $A_8$ | $A_{10}$ | $A_{12}$ | $A_{14}$ |
|---|---|---|---|
| 8.017E−06 | −4.706E−08 | −1.562E−09 | 1.907E−11 |

In the Table (8) listed below, there are shown data referred to FIG. 5 and the refractive index ($N_d$) of the LED lens 4 in the fourth embodiment:

TABLE (8)

| $\cos\theta_0$ | $\overline{OI_0}$ (mm) | $\overline{OP_0}$ (mm) | $\tan\theta_k$ | m' (mm) | $\cos\theta_c$ | $\tan\theta_e$ |
|---|---|---|---|---|---|---|
| 0.646 | 2.36 | 1.648 | 0.971 | 1.084 | 0.192 | 16.683 |

| $L_3$ (mm) | $R_E$ (mm) | h (mm) | $R_I$ (mm) | $\overline{I_0 E_0}$ (mm) | $L_2$ (mm) | $N_d$ |
|---|---|---|---|---|---|---|
| 3.528 | 14.8 | 0.864 | 3.5 | 1.79 | 0.211 | 1.49 |

In the fourth embodiment, the LED lens 4 is made from transparent resin material having a refraction index of 1.49. The effective divergence angle of the light source device 2 using the LED lens 4 is about 154°. An included angle between a connecting line from the center of the emitting surface of the LED 3 to the peak of the luminous intensity of a light pattern and the optical axis Z is about 69°. The position of the optical path inversion point $P_0$ at the light incident surface 40 satisfies the condition (1). In this embodiment, distances from the center of the emitting surface O of the LED 3 to the light incident surface 40 decrease as the included angle θ increases in the range of θ<50°. Distances from the center of the emitting surface O of the LED to the light incident surface 40 increase as the angle θ increases in the range of θ≥50°. The second optically active area 401 of the light incident surface 40 is a concave surface corresponding to the LED 3. The others main technical features about the light incident surface 40 and the light emitting surface 41 according to the LED lens 4 of the present invention are disclosed in the previous paragraphs, therefore the same description about the LED lens 4 is omitted herein.

In the fourth embodiment, the values of the conditions (2)~(5) are calculated and shown following.

$$\frac{\overline{OP_0}}{\overline{OI_0}} = 0.698$$

$$\frac{\tan\theta_e}{\tan\theta_k} = 17.188$$

$$\frac{L_3}{0.5 * R_E} = 0.477$$

$$\frac{(0.5L + m'\cos\theta_c)}{\overline{OP_0} * \tan\theta_k} = 0.787$$

Therefore, the LED lens 4 of the fourth embodiment satisfies the conditions (2)~(5), respectively. Whereby a light distribution that the luminous intensity of the paraxial zone thereof is lower than the luminous intensity of the off-axis zone thereof is formed, and thereby enhancing the light emission angle of the light source device 2. Moreover, when the second optically active area 401 of the light incident surface 40 is a concave surface corresponding to the LED 3, compared with the LED lens having the second optically active area 401 being a convex surface (referred to the first, second, and third embodiments), the LED lens 4 of the fourth embodiment can distribute the light Lb more uniformly.

<Fifth Embodiment>

Figure 16:
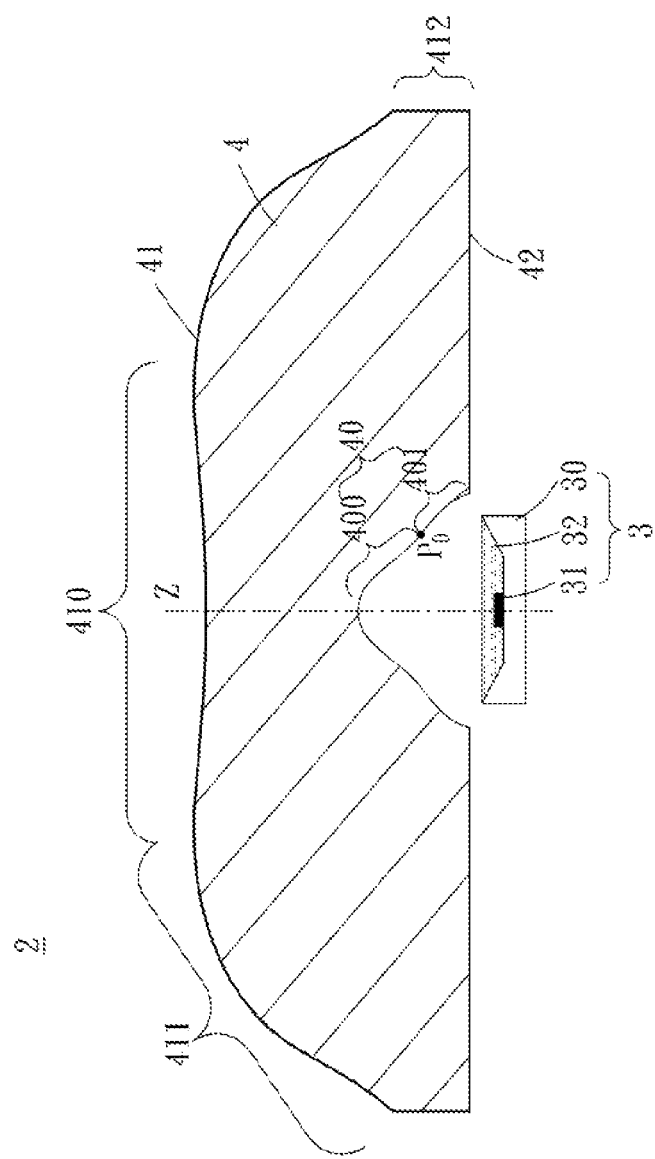
FIG. 16 is a cross-sectional view illustrating a light source device of the present invention according to the fifth embodiment thereof.
Figure 17:
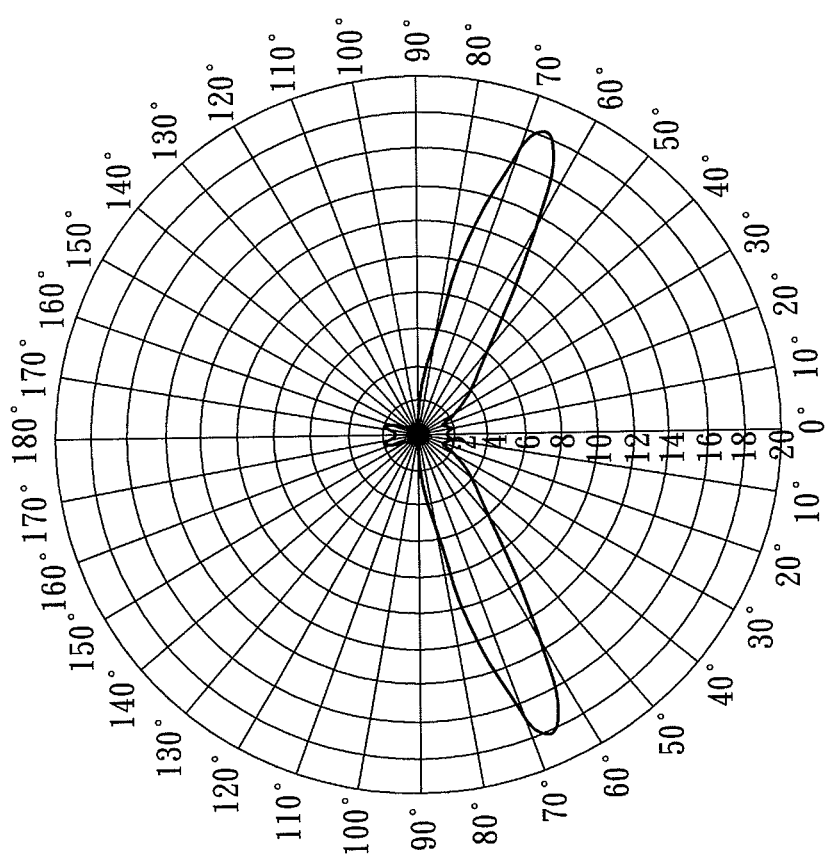
FIG. 17 is a polar candela distribution plot of a light source device of the present invention according to the fifth embodiment thereof.

Please refer to FIGS. 16 and 17, they are a cross-sectional view illustrating a light source device of the present invention according to the fifth embodiment thereof and a polar candela distribution plot thereof, respectively.

In the Table (9) listed below, there are shown the coefficients of the aspheric surface formula (6) constituting the light emitting surface 41 of the LED lens 4 in the fifth embodiment:

TABLE (9)

| c | K | $A_2$ | $A_4$ | $A_6$ |
|---|---|---|---|---|
| −6.418E+12 | −2.975E+04 | 1.957E−02 | 2.253E−03 | −2.770E−04 |

| $A_8$ | $A_{10}$ | $A_{12}$ | $A_{14}$ |
|---|---|---|---|
| 8.017E−06 | −4.706E−08 | −1.562E−09 | 1.907E−11 |

In the Table (10) listed below, there are shown data referred to FIG. 5 and the refractive index ($N_d$) of the LED lens 4 in the fifth embodiment:

TABLE (10)

| $\cos\theta_0$ | $\overline{OI_0}$ (mm) | $\overline{OP_0}$ (mm) | $\tan\theta_k$ | m' (mm) | $\cos\theta_c$ | $\tan\theta_e$ |
|---|---|---|---|---|---|---|
| 0.66 | 2.2 | 1.55 | 0.989 | 1.029 | 0.112 | 16.673 |

| $L_3$ (mm) | $R_E$ (mm) | h (mm) | $R_I$ (mm) | $\overline{I_0E_0}$ (mm) | $L_2$ (mm) | $N_d$ |
|---|---|---|---|---|---|---|
| 3.526 | 14.8 | 0.822 | 3.44 | 2 | 0.211 | 1.49 |

In the fifth embodiment, the LED lens 4 is made from transparent resin material having a refraction index of 1.49. The effective divergence angle of the light source device 2 using the LED lens 4 is about 154°. An included angle between a connecting line from the center of the emitting surface of the LED 3 to the peak of the luminous intensity of a light pattern and the optical axis Z is about 68°. The position of the optical path inversion point $P_0$ at the light incident surface 40 satisfies the condition (1). In this embodiment, distances from the center of the emitting surface O of the LED 3 to the light incident surface 40 decrease as the included angle θ increases in the range of θ<48.7°. Distances from the center of the emitting surface O of the LED to the light incident surface 40 increase as the angle θ increases in the range of θ≥48.7°. The second optically active area 401 of the light incident surface 40 is a concave surface corresponding to the LED 3. The others main technical features about the light incident surface 40 and the light emitting surface 41 according to the LED lens 4 of the present invention are disclosed in the previous paragraphs, therefore the same description about the LED lens 4 is omitted herein.

In the fifth embodiment, the values of the conditions (2)~(5) are calculated and shown following.

$$\frac{\overline{OP_0}}{\overline{OI_0}} = 0.705$$

$$\frac{\tan\theta_e}{\tan\theta_k} = 16.855$$

$$\frac{L_3}{0.5 * R_E} = 0.476$$

$$\frac{(0.5L + m'\cos\theta_c)}{\overline{OP_0} * \tan\theta_k} = 0.760$$

Therefore, the LED lens 4 of the fifth embodiment satisfies the conditions (2)~(5), respectively. Whereby a light distribution that the luminous intensity of the paraxial zone thereof is lower than the luminous intensity of the off-axis zone thereof is formed, and thereby enhancing the light emission angle of the light source device 2.

<Sixth Embodiment>

Figure 18:
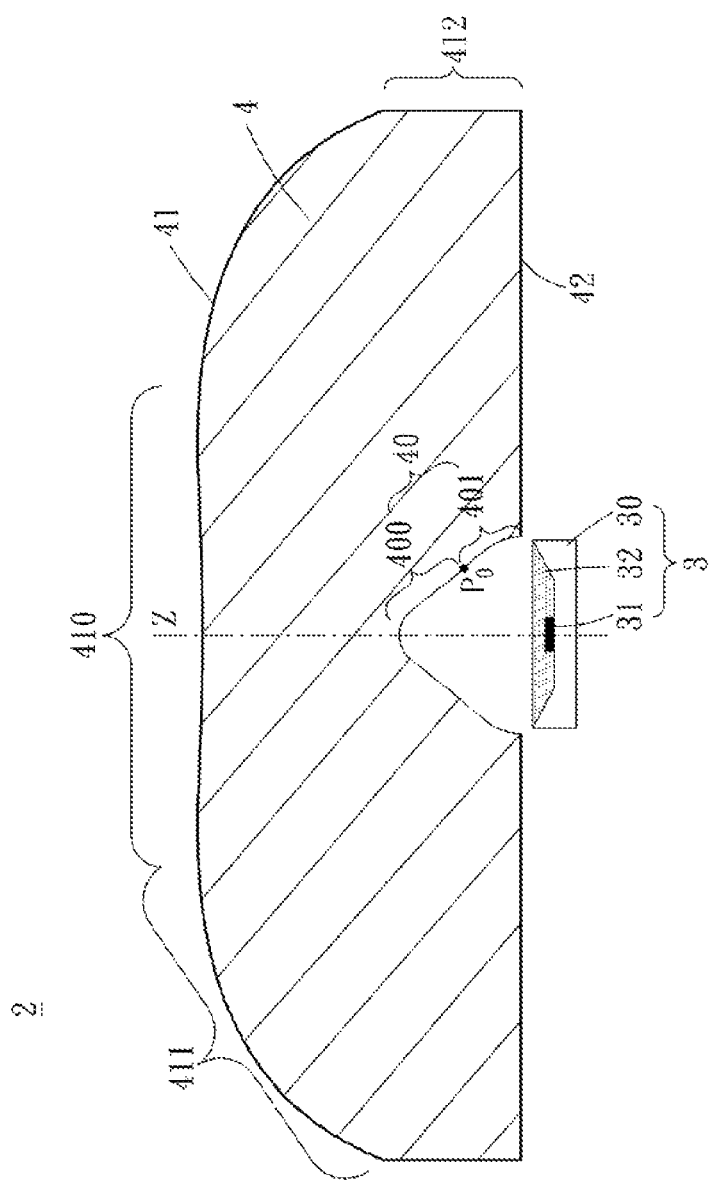
FIG. 18 is a cross-sectional view illustrating a light source device of the present invention according to the sixth embodiment thereof.
Figure 19:
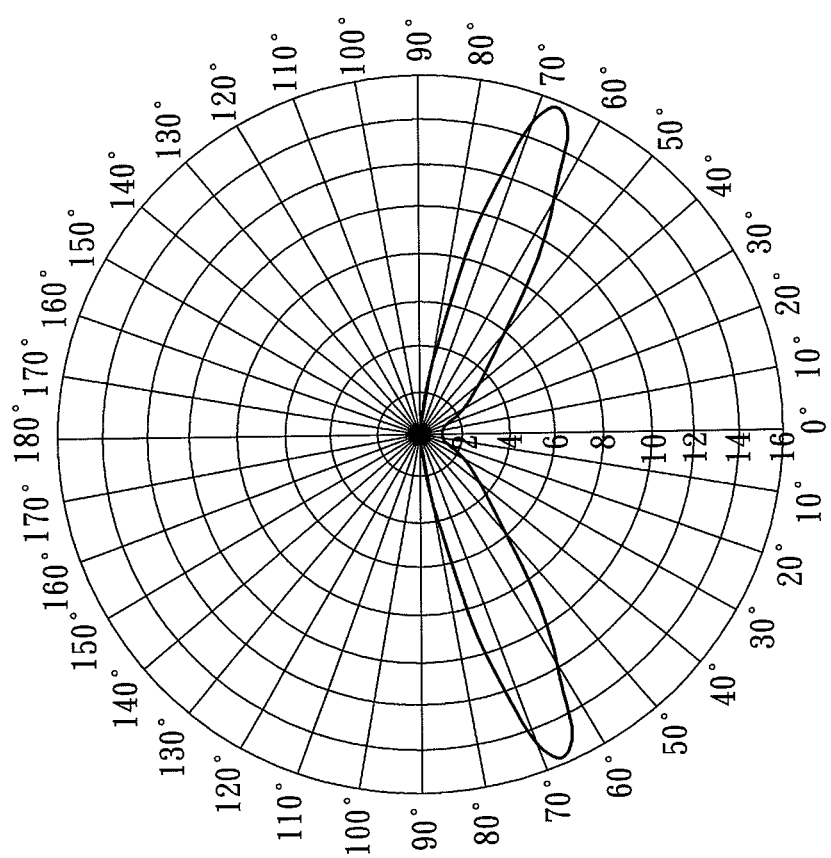
FIG. 19 is a polar candela distribution plot of a light source device of the present invention according to the sixth embodiment thereof.

Please refer to FIGS. 18 and 19, they are a cross-sectional view illustrating a light source device of the present invention according to the sixth embodiment thereof and a polar candela distribution plot thereof, respectively.

In the Table (11) listed below, there are shown the coefficients of the aspheric surface formula (6) constituting the light emitting surface 41 of the LED lens 4 in the sixth embodiment:

TABLE (11)

| c | K | $A_2$ | $A_4$ | $A_6$ |
|---|---|---|---|---|
| 0.01 | 10 | 3.889E−03 | 3.624E−03 | −4.624E−04 |

| $A_8$ | $A_{10}$ | $A_{12}$ | $A_{14}$ | $A_{16}$ |
|---|---|---|---|---|
| 2.121E−05 | −5.710E−07 | 1.013E−08 | −1.181E−10 | 6.568E−13 |

In the Table (12) listed below, there are shown data referred to FIG. 5 and the refractive index ($N_d$) of the LED lens 4 in the sixth embodiment:

TABLE (12)

| $\cos\theta_0$ | $\overline{OI_0}$ (mm) | $\overline{OP_0}$ (mm) | $\tan\theta_k$ | m' (mm) | $\cos\theta_c$ | $\tan\theta_e$ |
|---|---|---|---|---|---|---|
| 0.648 | 2.36 | 1.648 | 0.971 | 1.087 | 0.189 | 21.431 |

| $L_3$ (mm) | $R_E$ (mm) | h (mm) | $R_I$ (mm) | $\overline{I_0E_0}$ (mm) | $L_2$ (mm) | $N_d$ |
|---|---|---|---|---|---|---|
| 3.33 | 14.4 | 0.867 | 3.5 | 1.84 | 0.155 | 1.53 |

In the sixth embodiment, the LED lens 4 is made from transparent resin material having a refraction index of 1.53. The effective divergence angle of the light source device 2 using the LED lens 4 is about 154°. An included angle between a connecting line from the center of the emitting surface of the LED 3 to the peak of the luminous intensity of a light pattern and the optical axis Z is about 68°. The position of the optical path inversion point $P_0$ at the light incident surface 40 satisfies the condition (1). In this embodiment, distances from the center of the emitting surface O of the LED 3 to the light incident surface 40 decrease as the included angle θ increases in the range of θ<50°. Distances from the center of the emitting surface O of the LED to the light incident surface 40 increase as the angle θ increases in the range of θ≥50°. The second optically active area 401 of the light incident surface 40 is a concave surface corresponding to the LED 3. The others main technical features about the light incident surface 40 and the light emitting surface 41 according to the LED lens 4 of the present invention are disclosed in the previous paragraphs, therefore the same description about the LED lens 4 is omitted herein.

In the sixth embodiment, the values of the conditions (2)~(5) are calculated and shown following.

$$\frac{\overline{OP_0}}{\overline{OI_0}} = 0.689$$

$$\frac{\tan\theta_e}{\tan\theta_k} = 22.073$$

$$\frac{L_3}{0.5 * R_E} = 0.463$$

$$\frac{(0.5L + m'\cos\theta_c)}{\overline{OP_0} * \tan\theta_k} = 0.785$$

Therefore, the LED lens 4 of the sixth embodiment satisfies the conditions (2)~(5), respectively. Whereby a light distribution that the luminous intensity of the paraxial zone thereof is lower than the luminous intensity of the off-axis zone thereof is formed, and thereby enhancing the light emission angle of the light source device 2. Moreover, compared to the fourth embodiment, the sixth embodiment can distribute the light Lb more uniformly and widely by enhancing the ratio about condition (3), thus improving the light distribution uniformity of the light source device 2.

<Seventh Embodiment>

Figure 20:
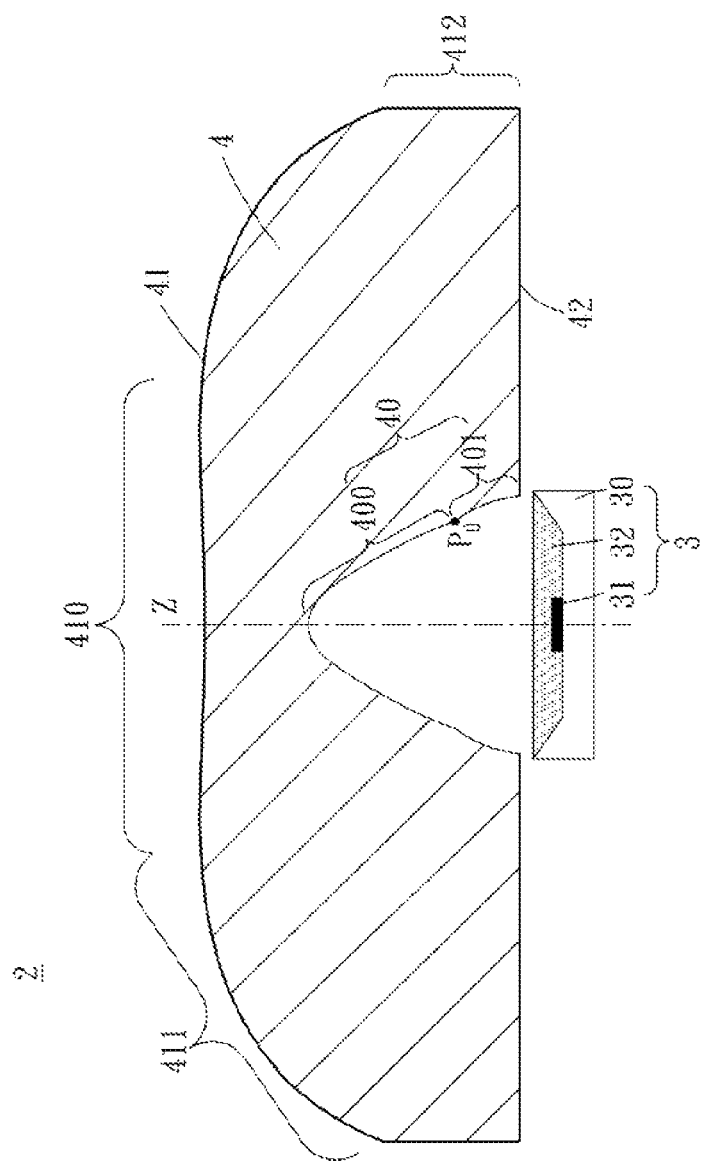
FIG. 20 is a cross-sectional view illustrating a light source device of the present invention according to the seventh embodiment thereof.
Figure 21:
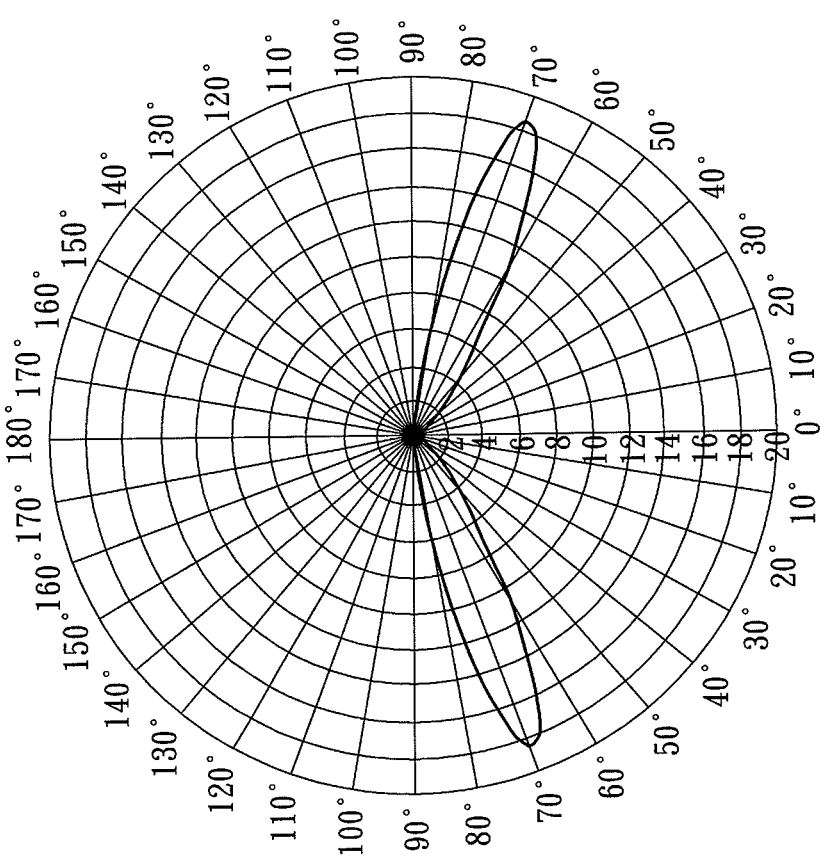
FIG. 21 is a polar candela distribution plot of a light source device of the present invention according to the seventh embodiment thereof.

Please refer to FIGS. 20 and 21, they are a cross-sectional view illustrating a light source device of the present invention according to the seventh embodiment thereof and a polar candela distribution plot thereof, respectively.

In the Table (13) listed below, there are shown the coefficients of the aspheric surface formula (6) constituting the light emitting surface 41 of the LED lens 4 in the seventh embodiment:

TABLE (13)

| c | K | $A_2$ | $A_4$ |
|---|---|---|---|
| −6.418E+12 | −2.229E+06 | 2.013E−02 | −1.443E−03 |
| $A_6$ | $A_8$ | $A_{10}$ | $A_{12}$ |
| 2.083E−05 | −4.889E−07 | 9.438E−09 | −9.540E−11 |

In the Table (14) listed below, there are shown data referred to FIG. 5 and the refractive index ($N_d$) of the LED lens 4 in the seventh embodiment:

TABLE (14)

| $\cos\theta_0$ | $\overline{OI_0}$ (mm) | $\overline{OP_0}$ (mm) | $\tan\theta_k$ | m' (mm) | $\cos\theta_c$ | $\tan\theta_e$ |
|---|---|---|---|---|---|---|
| 0.707 | 3.300 | 2.008 | 0.755 | 1.467 | 0.252 | 37.365 |
| $L_3$ (mm) | $R_E$ (mm) | h (mm) | $R_I$ (mm) | $\overline{I_0E_0}$ (mm) | $L_2$ (mm) | $N_d$ |
| 2.830 | 15.500 | 1.220 | 4.000 | 1.519 | 0.076 | 1.490 |

In the seventh embodiment, the LED lens 4 is made from transparent resin material having a refraction index of 1.49. The effective divergence angle of the light source device 2 using the LED lens 4 is about 156°. An included angle between a connecting line from the center of the emitting surface of the LED 3 to the peak of the luminous intensity of a light pattern and the optical axis Z is about 70°. The position of the optical path inversion point $P_0$ at the light incident surface 40 satisfies the condition (1). In this embodiment, distances from the center of the emitting surface O of the LED 3 to the light incident surface 40 decrease as the included angle θ increases in the range of θ<45°. Distances from the center of the emitting surface O of the LED to the light incident surface 40 maintain at 2.008 mm as the angle θ increases in the range of θ≥45°. The second optically active area 401 of the light incident surface 40 is a spherical surface whose center is at the center of the emitting surface of the LED 3. The others main technical features about the light incident surface 40 and the light emitting surface 41 according to the LED lens 4 of the present invention are disclosed in the previous paragraphs, therefore the same description about the LED lens 4 is omitted herein.

In the seventh embodiment, the values of the conditions (2)~(5) are calculated and shown following.

$$\frac{\overline{OP_0}}{\overline{OI_0}} = 0.609$$

$$\frac{\tan\theta_e}{\tan\theta_k} = 49.47$$

$$\frac{L_3}{0.5 * R_E} = 0.365$$

$$\frac{(0.5L + m'\cos\theta_c)}{\overline{OP_0} * \tan\theta_k} = 0.936$$

Therefore, the LED lens 4 of the seventh embodiment satisfies the conditions (2)~(5), respectively. Whereby a light distribution that the luminous intensity of the paraxial zone thereof is lower than the luminous intensity of the off-axis zone thereof is formed, and thereby enhancing the light emission angle of the light source device 2. Moreover, compared to the fourth embodiment, the seventh embodiment can distribute the light Lb more uniformly and widely by enhancing the ratio about condition (3), thus improving the light distribution uniformity of the light source device 2.

In summary, by the LED lens and the light source device thereof according to the present invention, a light pattern having a paraxial region with smaller luminous intensities than an off-axis region in the light pattern is generated, and the light emission angle and the light distribution uniformity of the light source device is improved. Thereby, a display requiring a backlight module can have better display quality, less chromatic aberration by using the present invention as a backlight source. Furthermore, due to the improved light emission angle and light distribution uniformity, the demand quantity of the LED light source device in a display is reduced, such that the volume of the LED backlight, the heat accumulation in the backlight module and costs are reduced. Moreover, it can be by one of the conditions (2) to (5) or a combination thereof to produce a light source device with better light distribution uniformity. In particular, to adjust the center darker region in the light pattern generated by the light source device at an appropriate size, such that to further enhance the divergence angle, the light distribution uniformity of the light source device, and correct chromatic aberration thereof, thus more appropriate to facilitate use in the thinner display device.

The present invention has been described with some preferred embodiments thereof and it is understood that many changes and modifications in the described embodiments can be carried out without departing from the scope and the spirit of the invention that is intended to be limited only by the appended claims.

What is claimed is:

1. An LED lens, applied for an LED assembly including an LED and the LED lens disposed on an emitting surface of the LED;
    the LED lens comprising a light incident surface, a light emitting surface, and a bottom surface extending from the light incident surface and connected to the light emitting surface; wherein the light emitting surface is an aspheric surface being symmetrical to an optical axis of the LED assembly, and includes a recession portion disposed at the center of the light emitting surface and a convex portion connected to the outer periphery of the recession portion;
    wherein the light incident surface is a concave surface being symmetrical to the optical axis, and includes a first optically active area and a second optically active area; the first optically active area being disposed at the center of the light incident surface, the second optically active area being connected with the first optically active area and the bottom surface; wherein an optical path inversion point is disposed at the junction between the first optically active area and the second optically active area; wherein $\theta_0$ is an included angle between the optical axis and a connecting line from the optical path inversion point to the center of the emitting surface of the LED; the LED lens satisfying the following condition:

$0.71 \geq \cos\theta_0 \geq 0.51$ when $\theta < \theta_0$, a distance from the center of the emitting surface of the LED to the light incident surface decreases as the angle $\theta$ increases; as $\theta \geq \theta_0$, the distance from the center of the emitting surface of the LED to the light incident surface increases or maintains a certain value as the angle $\theta$ increases; wherein $\theta$ is an included angle between the optical axis and a connecting line from the center of the emitting surface of the LED to the arbitrary point on the light incident surface,
    the LED lens further satisfying the following condition:

$$0.5 \leq \frac{\overline{OP_0}}{\overline{OI_0}} \leq 0.8$$

wherein, $\overline{OI_0}$ represents a distance from the center of the emitting surface of the LED to the point of intersection between the light incident surface and the optical axis; and $\overline{OP_0}$ represents a distance from the center of the emitting surface of the LED to the optical path inversion point.

2. The LED lens as claimed in claim 1, further satisfying the following condition:

$$10 \leq \frac{\tan\theta_e}{\tan\theta_k} \leq 50$$

wherein, $\theta_e$ represents the included angle between the optical axis and a connecting line connected from the intersection point of the light emitting surface and the optical axis to an apex of the light emitting surface; $\theta_k$ represents the included angle between the optical axis and a connecting line connected from the intersection point of the light incident surface and the optical axis to the optical path inversion point.

3. The LED lens as claimed in claim 1, wherein the first optically active area of the light incident surface is an aspherical surface; and the second optically active area is a spherical surface whose center is at the center of the emitting surface of the LED.

4. The LED lens as claimed in claim 1, further satisfying the following condition:

$$\frac{1}{3} \leq \frac{L_3}{0.5 * R_E} \leq \frac{1}{2}$$

wherein, $L_3$ represents a distance from the apex of the light emitting surface to the optical axis along a direction perpendicular to the optical axis; $R_E$ represents a diameter of the light emitting surface of the LED lens.

5. The LED lens as claimed in claim 1, wherein distances from the arbitrary point on the light emitting surface to the light incident surface or the bottom surface along the direction of the optical axis are smaller or equal to 5 mm.

6. The LED lens as claimed in claim 1, wherein the recession portion of the light emitting surface is a concave surface opposite to the light incident surface that is downward from the inner periphery of the convex portion and has a radius of curvature smaller or equal to 0.01 mm at the intersection point with the optical axis.

7. A light source device, comprising:
    an LED being provided with an emitting surface;
    an LED lens according to the preceding claim 1, being disposed on an emitting surface of the LED along an optical axis;
    wherein, light emitted from the LED enters the light incident surface of the LED lens, and is emitted from the light emitting surface of the LED lens, thereby forming a light pattern having a paraxial region with lower luminous intensities than an off-axis region along with the optical axis.

8. The light source device as claimed in claim 7, further satisfying the following condition:

$$0.7 \leq \frac{(0.5L + m'\cos\theta_c)}{\overline{OP_0} * \tan\theta_k} \leq 1;$$

wherein, $\theta_k$ represents the included angle between the optical axis and a connecting line connected from the intersection point of the light incident surface and the optical axis to the optical path inversion point; L represents the diameter of the emitting surface of the LED; m' represents the shortest distance from the edge of the emitting surface of the LED to the optical path inversion point; $\theta_c$ represents the included angle between a connecting line from the edge of the emitting surface of the LED to the optical path inversion point and the plane where the emitting surface of the LED is located; and $\overline{OP_0}$ is the distance from the center of the emitting surface of the LED to the optical path inversion point.

9. The light source device as claimed in claim 7, wherein the LED lens further satisfies the following condition:

$$10 \le \frac{\tan\theta_e}{\tan\theta_k} \le 50$$

wherein, $\theta_e$ represents the included angle between the optical axis and a connecting line connected from the intersection point of the light emitting surface and the optical axis to an apex of the light emitting surface; $\theta_k$ represents the included angle between the optical axis and a connecting line connected from the intersection point of the light incident surface and the optical axis to the optical path inversion point.

10. The light source device as claimed in claim 7, wherein the LED lens further satisfies the following condition:

$$\frac{1}{3} \le \frac{L_3}{0.5*R_E} \le \frac{1}{2}$$

wherein, $L_3$ represents a distance from the apex of the light emitting surface to the optical axis along a direction perpendicular to the optical axis; $R_E$ represents a diameter of the light emitting surface of the LED lens.

11. The light source device as claimed in claim 7, wherein there is a gap between the plane where the bottom surface of the LED lens is located and the plane where the emitting surface of the LED is located.

12. The light source device as claimed in claim 7, wherein the light emitted from the LED is transmitted through media having lower refractive index than the refractive index of the LED lens, and then enters into the LED lens.

13. The light source device as claimed in claim 7, wherein the recession portion of the light emitting surface is a concave surface opposite to the light incident surface that is downward from the inner periphery of the convex portion and has a radius of curvature smaller or equal to 0.01 mm at the intersection point along with the optical axis.

* * * * *